United States Patent
Zhong et al.

(10) Patent No.: US 11,063,203 B2
(45) Date of Patent: Jul. 13, 2021

(54) APPARATUS AND METHOD FOR POLING A PIEZOELECTRIC FILM

(71) Applicant: QUALCOMM Incorporated, San Diego, CA (US)

(72) Inventors: Fan Zhong, Dublin, CA (US); Jack Conway Kitchens, II, Buffalo, NY (US); Leonard Eugene Fennell, San Jose, CA (US); Nicholas Ian Buchan, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 681 days.

(21) Appl. No.: 15/837,922

(22) Filed: Dec. 11, 2017

(65) Prior Publication Data
US 2018/0198055 A1 Jul. 12, 2018

Related U.S. Application Data

(60) Provisional application No. 62/443,732, filed on Jan. 8, 2017.

(51) Int. Cl.
*H01L 41/257* (2013.01)
*H01L 41/053* (2006.01)
*H01L 41/18* (2006.01)
*H01L 41/187* (2006.01)
*H01L 41/193* (2006.01)

(52) U.S. Cl.
CPC .......... *H01L 41/257* (2013.01); *H01L 41/053* (2013.01); *H01L 41/18* (2013.01); *H01L 41/1871* (2013.01); *H01L 41/1873* (2013.01); *H01L 41/1876* (2013.01); *H01L 41/1878* (2013.01); *H01L 41/193* (2013.01)

(58) Field of Classification Search
CPC ...... H01L 41/257; H01L 41/053; H01L 41/18
See application file for complete search history.

(56) References Cited

U.S. PATENT DOCUMENTS

| 7,937,025 B2 | 5/2011 | Nohsho et al. |
| 8,356,393 B2 | 1/2013 | Moriyama et al. |
| 8,565,569 B2 | 10/2013 | Jen et al. |
| 2004/0057497 A1* | 3/2004 | Lagowski ............... G01K 7/02 374/163 |
| 2007/0040478 A1* | 2/2007 | Tofail ..................... A61L 27/32 310/328 |
| 2011/0091149 A1* | 4/2011 | Jen ......................... B82Y 20/00 385/12 |

(Continued)

FOREIGN PATENT DOCUMENTS

CN 1410477 A 4/2003

*Primary Examiner* — Bryan P Gordon
(74) *Attorney, Agent, or Firm* — Holland & Hart LLP

(57) ABSTRACT

Disclosed are methods, devices, apparatuses, and systems for poling a piezoelectric film. A poling system can be a corona poling system including a corona source with one or more corona wires configured to transfer a corona discharge onto a major surface of the piezoelectric film. The poling system can further include a grid electrode interposed between the corona source and the piezoelectric film. A substrate including the piezoelectric film may be supported on a substrate support, where the substrate and the corona source are configured to move relative to each other during poling.

25 Claims, 12 Drawing Sheets

(56) References Cited

U.S. PATENT DOCUMENTS

| | | | |
|---|---|---|---|
| 2014/0355387 A1 | 12/2014 | Kitchens, II et al. | |
| 2015/0077475 A1* | 3/2015 | Mizukami | B41J 2/1628 |
| | | | 347/68 |
| 2015/0155474 A1 | 6/2015 | Tanimoto et al. | |
| 2015/0349240 A1* | 12/2015 | Mizukami | B41J 2/1645 |
| | | | 347/70 |
| 2016/0079514 A1* | 3/2016 | Tai | H01L 41/337 |
| | | | 310/368 |
| 2016/0291729 A1* | 10/2016 | Schardt | H01L 41/277 |

* cited by examiner

APPARATUS AND METHOD FOR POLING A PIEZOELECTRIC FILM

PRIORITY CLAIM

This application claims priority to U.S. Provisional Patent Application No. 62/443,732, entitled "LARGE-SCALE POLING TOOL FOR COPOLYMER POLING," and filed on Jan. 8, 2017, which is hereby incorporated by reference in its entirety and for all purposes.

TECHNICAL FIELD

This disclosure relates generally to poling of piezoelectric materials and more particularly to poling of piezoelectric materials using a corona discharge.

DESCRIPTION OF RELATED TECHNOLOGY

In a crystalline structure with several unit cells, electric dipoles are often randomly oriented. If the electric dipoles are randomly oriented in the crystalline structure of a piezoelectric material, the piezoelectric effect exhibited by the piezoelectric material will be negligible. To align the electric dipoles of a crystallized piezoelectric material, the crystallized piezoelectric material may be subjected to a process called poling that may include applying a strong electric field across the crystallized piezoelectric material so that the electric dipoles are oriented in a desired direction.

Piezoelectric devices, such as ultrasonic fingerprint sensor arrays, have become increasingly important in a wide variety of technological applications, including smartphones and other consumer electronic devices. In an ultrasonic fingerprint sensor array, an ultrasonic transmitter may be used to send an ultrasonic wave through an ultrasonically transmissive medium or media and towards an object to be detected. The transmitter may be operatively coupled with an ultrasonic sensor configured to detect portions of the ultrasonic wave that are reflected from the object. For example, in ultrasonic fingerprint imagers, an ultrasonic pulse may be produced by starting and stopping the transmitter during a very short interval of time. At each material interface encountered by the ultrasonic pulse, a portion of the ultrasonic pulse is reflected.

For example, in the context of an ultrasonic fingerprint imager, the ultrasonic wave may travel through a platen on which a person's finger may be placed to obtain a fingerprint image. After passing through the platen, some portions of the ultrasonic wave encounter skin that is in contact with the platen, e.g., fingerprint ridges, while other portions of the ultrasonic wave encounter air, e.g., valleys between adjacent ridges of a fingerprint, and may be reflected with different intensities back towards the ultrasonic sensor. The reflected signals associated with the finger may be processed and converted to a digital value representing the signal strength of the reflected signal. When multiple such reflected signals are collected over a distributed area, the digital values of such signals may be used to produce a graphical display of the signal strength over the distributed area, for example by converting the digital values to an image, thereby producing an image of the fingerprint. Thus, an ultrasonic sensor system may be used as a fingerprint imager or other type of biometric scanner. In some implementations, the detected signal strength may be mapped into a contour map of the finger that is representative of the depth of the ridge structure detail.

SUMMARY

The devices, systems, apparatuses, and methods of this disclosure each have several aspects, no single one of which is solely responsible for the desirable attributes disclosed herein.

One aspect of the subject matter of this disclosure can be implemented in an apparatus. The apparatus includes a substrate support configured to support a substrate including a piezoelectric film, a corona source including one or more corona wires configured to transfer a corona discharge onto a major surface of the substrate to pole the piezoelectric film, and a mechanism coupled to one or both of the substrate support and the corona source. The mechanism is configured to produce relative motion between the substrate and the corona source. The one or more corona wires extend along an axis parallel to the major surface of the substrate.

In some implementations, the apparatus further includes a grid electrode positioned between the corona source and the substrate support, where the grid electrode includes a plurality of through-holes. The apparatus further includes a first voltage source electrically connected to the corona source, a second voltage source electrically connected to the grid electrode, and a ground electrode, where the substrate support includes the ground electrode or is electrically connected to the ground electrode. In some implementations, the first voltage source is configured to induce a first voltage between about 7 kV and about 16 kV relative to the substrate support, and the second voltage source is configured to induce a second voltage between about 1 kV and about 10 kV relative to the substrate support. In some implementations, one or both of the first voltage source and the second voltage source is configured to ramp up to the first voltage and the second voltage, respectively. In some implementations, the apparatus further includes a mask positioned between the grid electrode and the substrate support and defining one or more masked regions and one or more unmasked regions of the substrate, where the mask is configured to block the corona discharge from the one or more masked regions of the substrate and expose the substrate to the corona discharge in the one or more unmasked regions of the substrate. In some implementations, the mechanism is coupled to at least the substrate support, the mechanism including one or both of a rotary stage configured to rotate the substrate support about an axis perpendicular to the major surface of the substrate and a linear translation system configured to translate the substrate support along a direction parallel to the major surface of the substrate. In some implementations, the mechanism is coupled to at least the corona source, the mechanism including one or both of a rotary stage configured to rotate the corona source about an axis perpendicular to the major surface of the substrate and a linear translation system configured to translate the corona source along a direction parallel to the major surface of the substrate. In some implementations, the substrate is a large-area substrate having a diameter or diagonal equal to or greater than about 3.5 inches. In some implementations, the one or more corona wires includes a linear array of multiple corona wires, each of the multiple corona wires being coplanar and substantially parallel to one another and being substantially uniformly spaced apart.

Another innovative aspect of the subject matter described in this disclosure can be implemented in an apparatus. The apparatus includes a substrate support configured to support a substrate including a piezoelectric film, a corona source including an array of pins configured to transfer a corona discharge onto a major surface of the substrate to pole the piezoelectric film, and a mechanism coupled to one or both of the substrate support and the corona source. The mechanism is configured to produce relative motion between the substrate and the corona source. Each of the pins is oriented in a longitudinal axis perpendicular to the major surface of the substrate.

In some implementations, the apparatus further includes a grid electrode positioned between the corona source and the substrate support, where the grid electrode includes a plurality of through-holes, a first voltage source electrically connected to the corona source, a second voltage source electrically connected to the grid electrode, and a ground electrode, where the substrate support includes the ground electrode or is electrically connected to the ground electrode. In some implementations, the mechanism is coupled to at least the substrate support, the mechanism including one or both of a rotary stage configured to rotate the substrate support about an axis perpendicular to the major surface of the substrate and a linear translation system configured to translate the substrate support along a direction parallel to the major surface of the substrate. In some implementations, the mechanism is coupled to at least the corona source, the mechanism including one or both of a rotary stage configured to rotate the corona source about an axis perpendicular to the major surface of the substrate and a linear translation system configured to translate the corona source along a direction parallel to the major surface of the substrate.

Another innovative aspect of the subject matter described in this disclosure can be implemented in a method of poling a piezoelectric film. The method includes providing a substrate on a substrate support, where the substrate includes a piezoelectric film. The method further includes applying a first voltage to a corona source positioned over the substrate support, where the corona source includes one or more corona wires that generate and transfer a corona discharge onto a major surface of the piezoelectric film upon application of the first voltage, where the one or more corona wires extend along an axis parallel to the major surface of the substrate. The method further includes moving the substrate relative to the corona source.

In some implementations, moving the substrate relative to the corona source includes rotating one or both of the substrate and the corona source about an axis perpendicular to the major surface of the substrate. In some implementations, moving the substrate relative to the corona source includes translating one or both of the substrate and the corona source along a direction parallel to the major surface of the substrate. In some implementations, the method further includes applying a second voltage to a grid electrode positioned between the corona source and the substrate support.

BRIEF DESCRIPTION OF THE DRAWINGS

Details of one or more implementations of the subject matter described in this specification are set forth in the accompanying drawings and the description below. Other features, aspects, and advantages will become apparent from the description, drawings and claims. Note that the relative dimensions of the following figures may not be drawn to scale.

Like reference numbers and designations in the various drawings indicate like elements.

DETAILED DESCRIPTION

Figure 1:
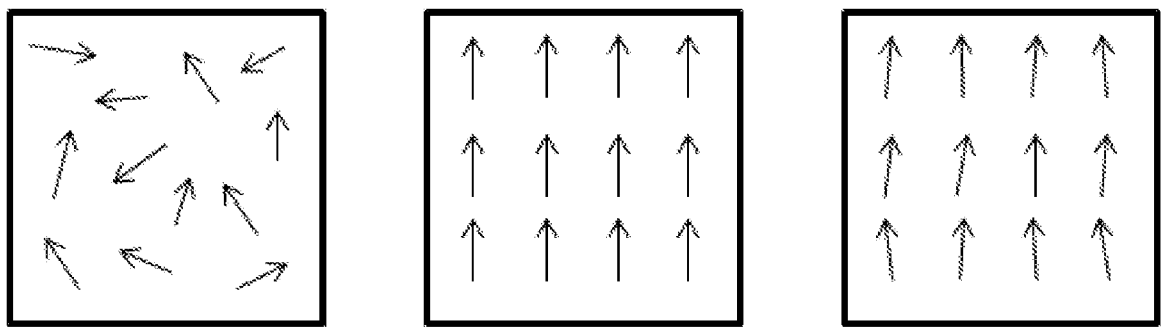
FIG. 1 shows schematic illustrations of electric dipoles oriented in random directions prior to poling, oriented in a uniform direction during poling, and oriented in a substantially uniform direction after poling.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system for poling a piezoelectric film. In addition, it is contemplated that the described implementations or the piezoelectric film may be included in or associated with a variety of electronic devices such as, but not limited to: mobile telephones, multimedia Internet enabled cellular telephones, mobile television receivers, wireless devices, smartphones, smart cards, wearable devices such as bracelets, armbands, wristbands, rings, headbands and patches, etc., Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), mobile health devices, computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, automatic teller machines (ATMs), parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Implementations described herein relate to an apparatus for poling a piezoelectric film. The apparatus includes a substrate support for supporting a substrate with a piezoelectric film and a corona source over the substrate support, where the apparatus is configured to produce relative motion between the substrate and the corona source. The corona source may include an array of pins configured to transfer a corona discharge onto the substrate to pole the piezoelectric film where each of the pins is oriented in a longitudinal axis perpendicular to a major surface of the substrate, or the corona source may include one or more corona wires configured to transfer a corona discharge onto the substrate to pole the piezoelectric film where each of the corona wires extends along an axis parallel to the major surface of the substrate. In some implementations, the apparatus may further include a grid electrode positioned between the corona source and the substrate support, where the grid electrode includes a plurality of through-holes. In some implementations, the apparatus may further include a mechanism coupled to the substrate support, where the mechanism is configured to rotate the substrate support and/or linearly translate the substrate support. In some implementations, the apparatus may further include a mechanism coupled to the corona source, where the mechanism is configured to rotate the corona source and/or linearly translate the corona source.

Particular implementations of the subject matter described in this disclosure may be implemented to realize one or more of the following potential advantages. The apparatus for poling a piezoelectric film may pole piezoelectric materials with a high piezoelectric coefficient, and a high piezoelectric coefficient is indicative of high piezoelectricity. Compared to direct contact poling techniques, the non-contact poling technique used by the apparatus in this disclosure is less susceptible to losing the poling field due to dielectric breakdown or excessive current leakage. The apparatus also reduces the risk of particulate contamination and physical damage or alteration of the piezoelectric film by eliminating direct contact between the piezoelectric film and poling electrodes. The apparatus may also eliminate or reduce the need for voltage ramp up/down profiles and allow for in-line continuous feed poling of large substrates. Furthermore, the apparatus is designed to improve uniformity of poling across the piezoelectric film so that electric dipoles of the piezoelectric film are subject to a uniform alignment field. Additionally, the apparatus is able to uniformly pole small area substrates as well as uniformly pole in bulk manufacturing processes, including in large area substrates and in roll-to-roll manufacturing processes.

FIG. 1 shows schematic illustrations of electric dipoles oriented in random directions prior to poling, oriented in a uniform direction during poling, and oriented in a substantially uniform direction after poling. When piezoelectric materials are initially formed and crystallized, an orientation of electric dipoles may be random. A piezoelectric effect of the crystallized piezoelectric material may depend upon the orientation of the electric dipoles within the material. Crystallized piezoelectric materials are subjected to a process called poling that includes applying a strong electric field across the piezoelectric material to align the electric dipoles in a desired orientation as shown in FIG. 1.

In some conventional applications, poling a piezoelectric layer may be accomplished by direct-contact poling. In direct-contact poling, two separate metal electrodes contact both sides of a piezoelectric layer and then apply a large voltage across the piezoelectric layer. This causes an electric field to develop within the piezoelectric layer. The electric field causes the electric dipoles to align in the same direction. Once the electric field is removed, the electric dipoles will generally stay in the aligned state unless a similarly strong electric field is applied in a different direction. Smaller electric fields generally will either not affect the alignment or will only temporarily affect the alignment.

However, implementations of the present disclosure pole a piezoelectric layer using corona poling or corona discharge poling, which uses ionized molecules and electrons generated and deposited on a surface of the piezoelectric layer, creating a poling field in the piezoelectric layer that can align the electric dipoles into a desired orientation. There is no direct contact between the corona source and the piezoelectric layer when using corona poling. A non-contact poling technique is less susceptible to losing a poling field due to dielectric breakdown or excessive current leakage through pinholes in the piezoelectric layer. Without contact between the piezoelectric layer and poling electrodes, risk of particulate contamination and physical damage or alteration of the piezoelectric layer is reduced. Direct-contact poling techniques generally require complicated voltage ramp-up and ramp-down profiles to prevent dielectric breakdown of the piezoelectric layer and possible damage from applied poling voltages to electronic circuits that may be formed on the substrate, such as electronic circuits that provide functionality to a fingerprint sensor. However, a non-contact poling technique as described herein may eliminate or reduce the need for voltage ramp-up and ramp-down profiles and allow for in-line continuous feed poling of large substrates.

A material of the piezoelectric layer to be poled may be any suitable piezoelectric material. Examples include but are not limited to ceramic-based piezoelectric materials such as barium titanate ($BaTiO_3$), lead zirconium titanate ($Pb(Zr_xTi_{1-x})O_3$), potassium niobate ($KNbO_3$), zinc oxide (ZnO), and bismuth ferrite ($BiFeO_3$). Other examples include but are not limited to polymer-based piezoelectric materials such as polyvinylidene fluoride (PVDF) and polyvinylidene fluoride-trifluoroethylene (PVDF-TrFE) copolymers. Examples of PVDF copolymers include 60:40 (molar percent) PVDF-TrFE, 70:30 PVDF-TrFE, 80:20 PVDF-TrFE, and 90:10 PVDF-TrFE. Other examples of piezoelectric materials that may be employed include polyvinylidene chloride (PVDC) homopolymers and copolymers, polytetrafluoroethylene (PTFE) homopolymers and copolymers, and diisopropylammonium bromide (DIPAB).

PVDF or PVDF-TrFE may be useful in sensor-based applications including in ultrasonic fingerprint sensor applications. PVDF may be provided in existing roll-to-roll manufacturing processes for bulk manufacturing. Some piezoelectric materials, such as PVDF-TrFE copolymers, may be provided on substrates or panels but are generally not provided in roll-to-roll manufacturing processes. PVDF-TrFE copolymers may not exhibit the same limitations regarding resolution, signal-to-noise ratio, and image quality as PVDF in the context of sensor-based applications. PVDF-TrFE may also have higher electromechanical coupling efficiency than PVDF. Furthermore, PVDF-TrFE generally has a higher piezoelectric coefficient $d_{33}$. The capability of a piezoelectric material to generate electric charge in response to mechanical stress (or the converse) may be characterized in terms of piezoelectric coefficient $d_{33}$. The piezoelectric coefficient $d_{33}$ represents a ratio of charge generated by the piezoelectric material under stress and the force upon the piezoelectric material that generates the stress. By way of an example, an 80:20 PVDF-TrFE copolymer may exhibit a piezoelectric coefficient $d_{33}$ of about 24 picocoulombs/Newton while PVDF may exhibit a piezoelectric coefficient $d_{33}$ of about 16 picocoulombs/Newton. However, since PVDF-TrFE copolymers are generally not provided in existing roll-to-roll manufacturing processes, bulk manufacturing of PVDF-TrFE copolymers are mostly limited to small-area and large-area substrates or panels. Uniformly poling piezoelectric materials on large-area substrates and panels, however, presents many challenges.

Implementations of the present disclosure relate to apparatuses and methods for poling a piezoelectric layer. The piezoelectric layer may or may not be provided on a substrate. The piezoelectric layer may be provided on any suitable substrate including silicon wafers, glass substrates, silicon substrates with integrated circuitry, thin film transistor (TFT) substrates, display substrates such as liquid crystal display (LCD) or organic light emitting diode (OLED) display substrates, or plastic substrates. The piezoelectric layer may be disposed, positioned, placed, or formed on the substrate. However, it will be understood that the substrate may consist of the piezoelectric layer, meaning that what is provided on a substrate support is the piezoelectric layer itself to be poled. Accordingly, a substrate may refer to one or more substrate materials on which the piezoelectric layer is disposed upon or may refer to the piezoelectric layer itself. The substrate including the piezoelectric layer to be poled may be a large-area substrate. A large-area substrate as used herein includes any substrate having a diameter or diagonal equal to or greater than about 3.5 inches. An example includes a silicon substrate with a diameter of 100 mm or larger. Another example includes a glass or polymer TFT substrate having dimensions of 195 mm×210 mm (diagonal>11 inches) and larger. Yet another example includes a glass or polymer TFT substrate having dimensions of G4.5 specification including a substrate having dimensions of 730 mm×920 mm (diagonal>46 inches) and larger.

To pole the piezoelectric layer of the substrate using a non-contact poling technique, a corona source is positioned over the substrate. The corona source may be any suitable corona source as described herein, including a corona source having an array of pins or a corona source having one or more corona wires. The corona source is configured to transfer a corona discharge onto a major surface of the substrate to pole the piezoelectric layer. The major surface of the substrate is the surface of the substrate facing towards the corona source, where the major surface of the substrate may be defined by a horizontal plane on which the substrate is supported. A corona discharge occurs when a high voltage is induced in the corona source relative to an electrical ground. For example, an electrical ground may be provided by a substrate support that supports the substrate having the piezoelectric layer. The corona discharge may be caused by ionization of a fluid or medium, such as air, surrounding a conductor that is electrically charged. Coronas occur when the strength of the electric field around the conductor is high enough to form a conductive region in the medium but not high enough to cause electrical breakdown of the surrounding medium or arcing to nearby objects. In a negative corona discharge, if air is the surrounding medium, the resulting ionized fluid in a drift region may include a number of ions. In the drift region the principal ions are $CO_3^-$ and $O_3^-$. Other ions such as $O_2^-$, $NO^+$, $O_2^+$ and $O^-$ are also present in lower concentrations. The fluid may also include a number of neutral species such as nitrous oxide ($N_2O$), ozone ($O_3$), nitrogen dioxide ($NO_2$), carbon monoxide (CO), carbon dioxide ($CO_2$), nitric oxide (NO) and nitric acid ($HNO_3$). In some implementations, the surrounding medium may be dry air so as to reduce the presence of water vapor, thereby avoiding or minimizing the generation of highly conductive and reactive nitric acid in poling operations.

Figure 2A:
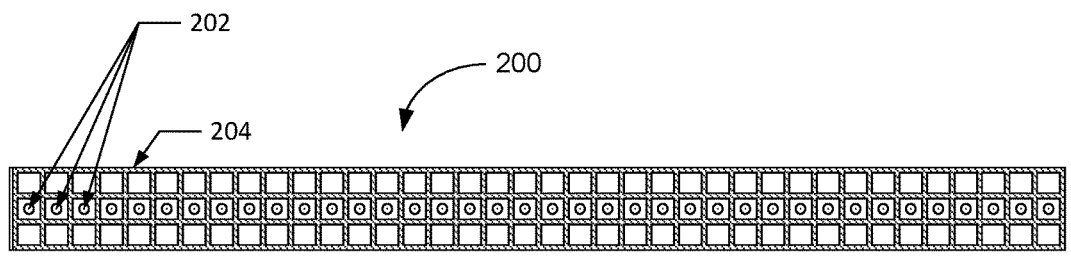
FIG. 2A is a schematic illustration showing a bottom view of an example corona source including a linear array of pins according to some implementations.
Figure 2B:
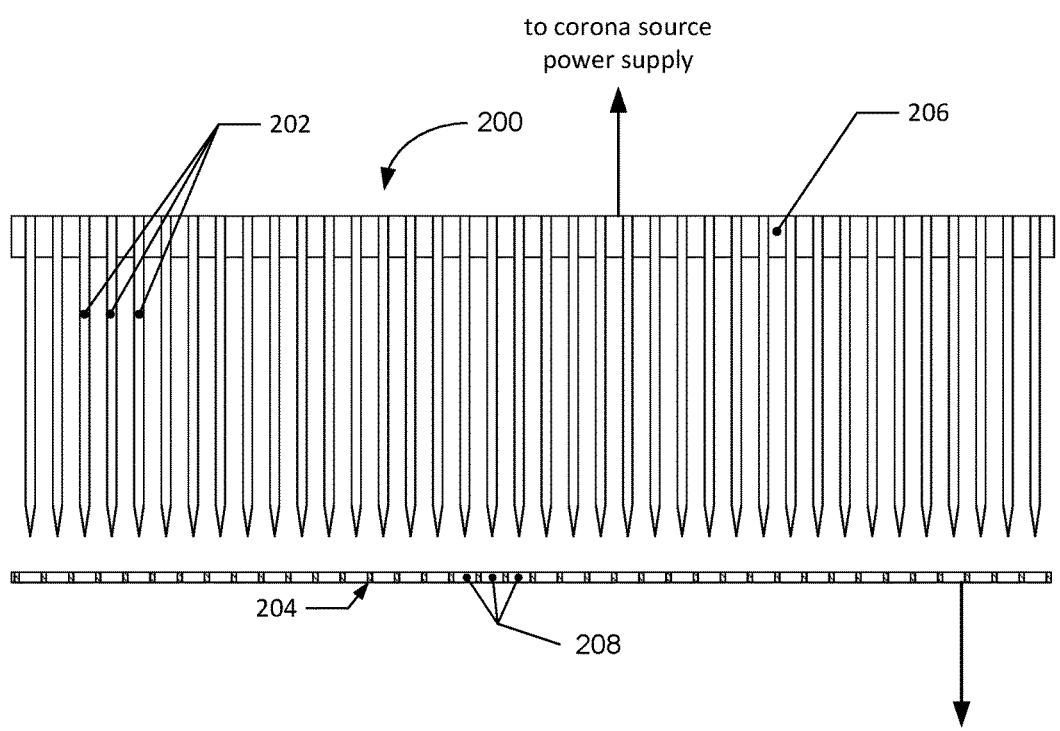
FIG. 2B is a schematic illustration showing a side view of the example corona source of FIG. 2A according to some implementations.

In some implementations, the corona source includes an array of pins or needles for poling a piezoelectric layer. FIG. 2A is a schematic illustration showing a bottom view of an example corona source including a linear array of pins according to some implementations. FIG. 2B is a schematic illustration showing a side view of the example corona source of FIG. 2A according to some implementations. In FIGS. 2A-2B, the corona source 200 includes a linear array of pins 202, where the linear array of pins 202 is arranged as a single row of pins 202. The pins 202 may also be referred to as needles. Each of the pins 202 may be identical or substantially identical in length. Each of the pins 202 are oriented so that their longitudinal axis is perpendicular to a major plane or surface of a substrate (not shown), where the substrate includes a piezoelectric layer. The linear array of pins 202 may be arranged in a line that is orthogonal to the longitudinal axis of each of the pins 202. The linear array of pins 202 may be supported by or suspended from a support frame 206. For example, the support frame 206 may be a pin back plate.

In some implementations, the corona source 200 includes a grid electrode 204 positioned below the linear array of pins 202. The grid electrode 204 may be positioned between the linear array of pins 202 and the substrate. In some implementations, a distance between the linear array of pins 202 and the grid electrode 204 is between about 1 mm and about 10 mm. The grid electrode 204 may include a plurality of through-holes 208. In some implementations, the grid electrode 204 may be a mesh or a laser- or chemically etched-etched screen. The grid electrode 204 and the linear array of pins 202 may form a "pin-grid array" of the corona source 200, though it will be understood that the grid electrode 204 may be independent and separate from the corona source 200. The grid electrode 204 may be positioned below the linear array of pins 202 so that tips of each of the pins 202 may be arranged over each of the through-holes 208 of the grid electrode 204. The grid electrode 204 may be parallel to the major plane or surface of the substrate with the piezoelectric layer. The linear array of pins 202 may be electrically connected to a corona voltage source or power supply. The grid electrode 204 may be electrically connected to a grid voltage source or power supply.

Each of the pins 202 may include an electrically conductive material, such as a metal. The pins 202 of the corona source 200 may serve as an electrode in a corona poling system, where the other electrode in the corona poling system may be a ground electrode. Each of the pins 202 may be relatively long compared to its diameter. For example, each of the pins 202 may be between about 5 mm and about 150 mm long (e.g., 75 mm) and may have a diameter between about 0.25 mm and about 3 mm (e.g., 1 mm to 1.5 mm). The linear array of pins 202 may be closely spaced together. For example, the linear array of pins 202 may be spaced between about 0.1 inches and about 0.5 inches (e.g., 0.25 inches) center-to-center spacing. In addition, each of the pins 202 may have ends or tips that are tapered. In some implementations, the ends/tips of the pins 202 may have a taper between about 30 degrees and about 60 degrees to obtain relatively sharp ends/tips.

Figure 3:
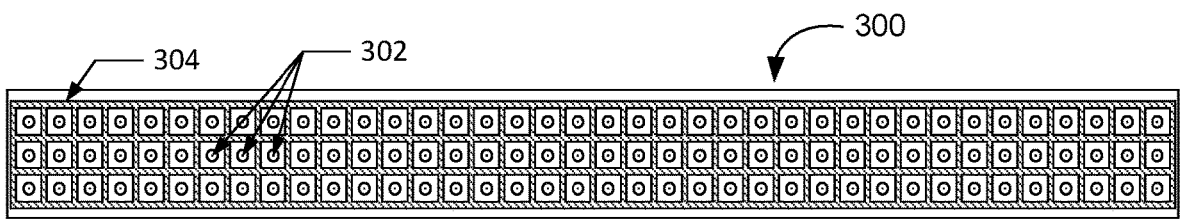
FIG. 3 is a schematic illustration showing a bottom view of an example corona source including a two-dimensional 3×38 array of pins according to some implementations.
Figure 4:
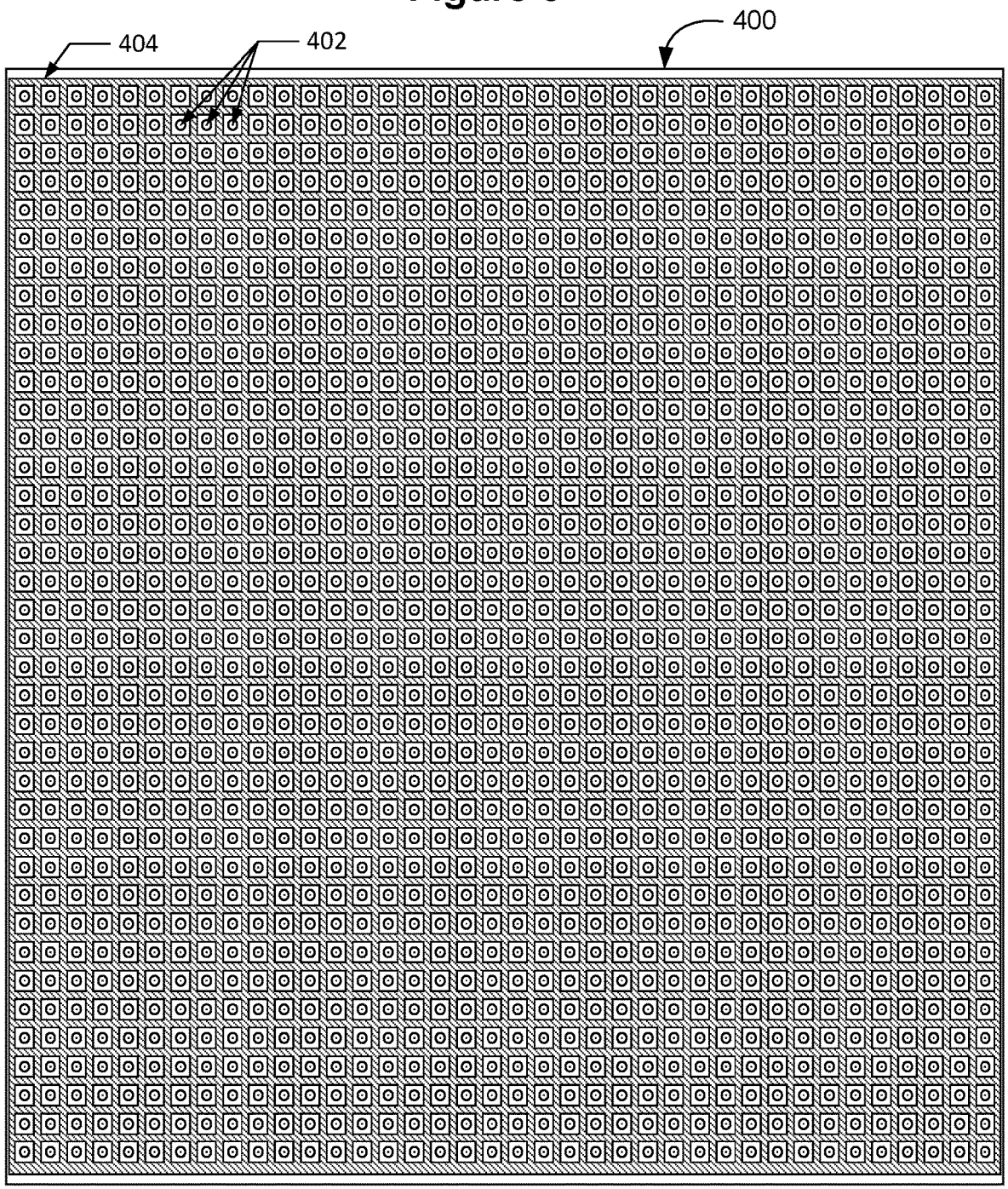
FIG. 4 is a schematic illustration showing a bottom view of an example corona source including a two-dimensional 38×38 array of pins according to some implementations.

In some implementations, the corona source includes an array of pins or needles arranged in a two-dimensional (2-D) array. FIG. 3 is a schematic illustration showing a bottom view of an example corona source including a two-dimensional 3×38 array of pins according to some implementations. In FIG. 3, the corona source 300 includes a 3×38 array of pins 302 and a grid electrode 304. FIG. 4 is a schematic illustration showing a bottom view of an example corona source including a two-dimensional 38×38 array of pins according to some implementations. In FIG. 4, the corona source 400 includes a 38×38 array of pins 402 and a grid electrode 404. Aside from having a 1-D linear arrangement, various aspects discussed above of the corona source 200 for the linear array of pins 202 in FIGS. 2A-2B apply to the corona source 300 for the 2-D array of pins 302 in FIG. 3 and to the corona source 400 for the 2-D array of pins 402 in FIG. 4. It will be understood that a 2-D array of pins in a corona source can have any m×n arrangement, where m and n are integer values. In some implementations, more pins may provide greater coverage and uniformity for poling a piezoelectric layer. In some implementations, a higher density of pins may provide greater uniformity for poling a piezoelectric layer.

Figure 5A:
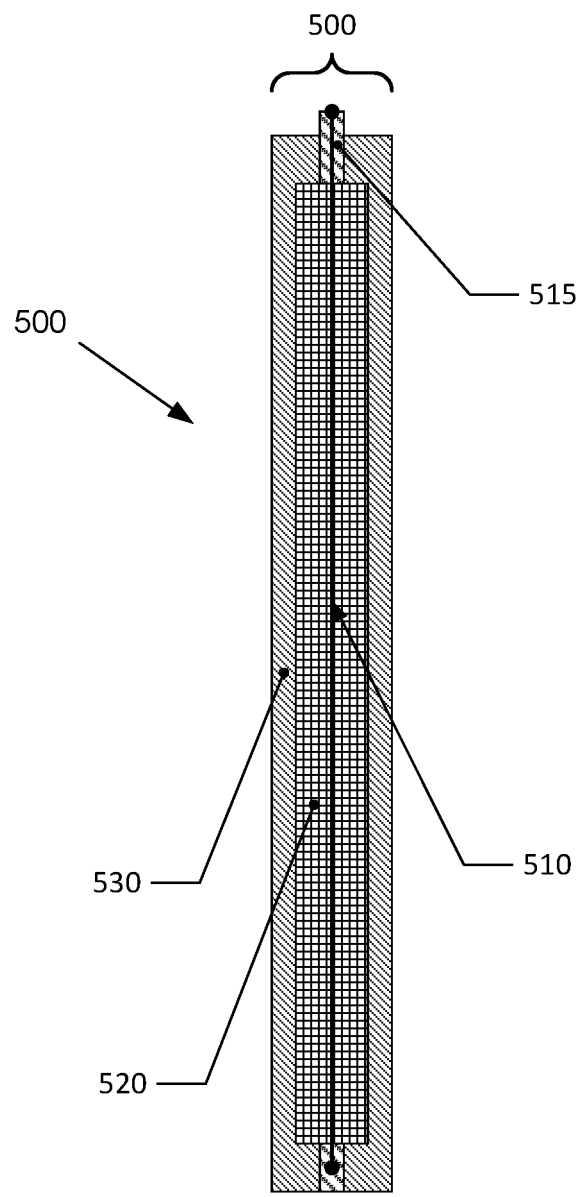
FIG. 5A is a schematic illustration showing a bottom view of an example corona source including a single corona wire according to some implementations.
Figure 5B:
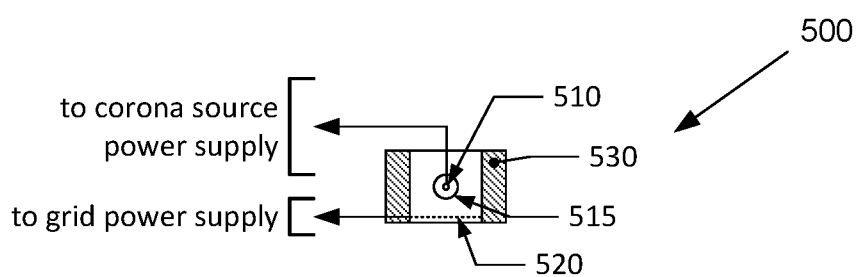
FIG. 5B is a schematic illustration showing a side view of the example corona source of FIG. 5A according to some implementations.

In some implementations, the corona source includes a single corona wire or a plurality of corona wires. FIG. 5A is a schematic illustration showing a bottom view of an example corona source including a single corona wire according to some implementations. FIG. 5B is a schematic illustration showing a side view of the example corona source of FIG. 5A according to some implementations. The corona source 500 may be a corona wire device including a single corona wire 510 within a support frame or housing 530. The corona wire 510 may be a relatively long, thin electrically conductive electrode or wire, where the electrically conductive electrode or wire may be referred to as a corona wire or corona electrode. The corona wire 510 may serve as an electrode in a corona poling system, where the other electrode in the corona poling system may be a ground electrode. The corona wire 510 may be oriented so that its longitudinal axis is parallel to a major plane or surface of a substrate (not shown), where the substrate includes a piezoelectric layer. In some implementations, the corona wire 510 is suspended in a space within the support frame or housing 530, where the corona wire 510 may be held or supported by a corona wire holder 515 at opposite ends of the corona wire 510.

In some implementations, the corona source 500 includes a grid electrode 520 positioned below the corona wire 510. In some implementations, a distance between the corona wire 510 and the grid electrode is between about 1 mm and about 10 mm. The grid electrode 520 may include a plurality of through-holes, where characteristic hole openings may be, for example, between about 50 µm and about 5 mm in diameter. In some implementations, the grid electrode 520 may be a mesh or laser- or chemically-etched screen. The grid electrode 520 and the corona wire 510 may form a part of a corona wire device, though it will be understood that the grid electrode 520 may be independent and separate from the corona source 500. In some implementations, however, the grid electrode 520 may be connected with the support frame or housing 530. The grid electrode 520 may be parallel to the major plane or surface of the substrate. Accordingly, the grid electrode 520 may also be parallel with the corona wire 510. The corona wire 510 may be electrically connected to a corona voltage source or power supply. The grid electrode 520 may be electrically connected to a grid voltage source or power supply.

Figure 6:
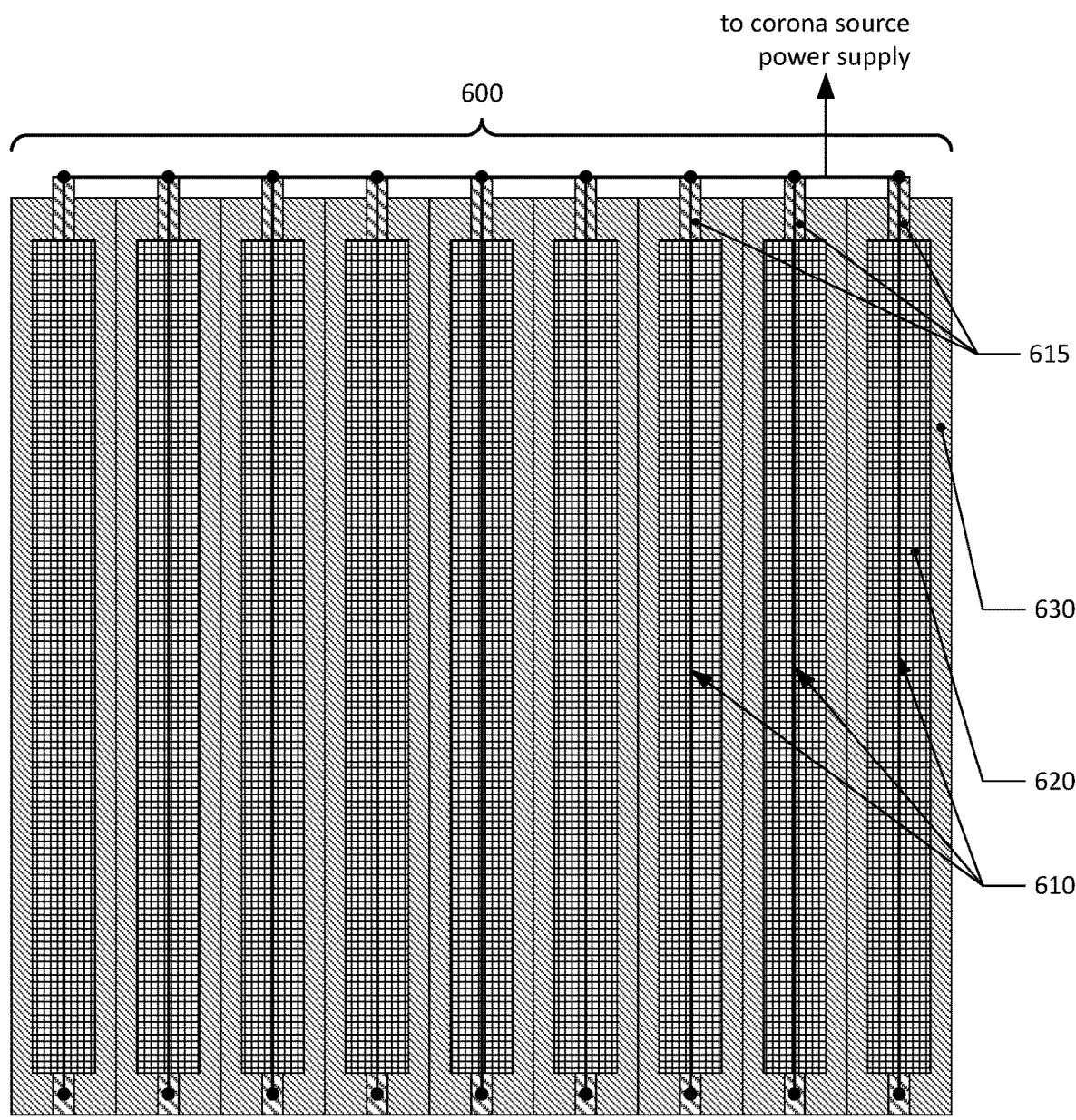
FIG. 6 is a schematic illustration showing a bottom view of an example corona source including a linear array of corona wires according to some implementations.

Corona wire devices, such as shown in FIGS. 5A-5B and 6, may be used in conventional photocopying machines and laser printers. A corona wire device may also be referred to as a "corotron." Where the corona wire device includes a screen or grid electrode, the corona wire device may be referred to as a "scorotron." Corotrons and/or scorotrons may be available from Xerox Corporation of Norwalk, Conn. as well as from various suppliers of parts for photocopying machines and laser printers.

The corona wire 510 may include an electrically conductive material, such as a metal. Example metals include but are not limited to tungsten (e.g., gold-plated tungsten) or platinum. The corona wire 510 may be relatively long compared to its diameter. For example, the corona wire 510 may have a length between about 10 mm and about 1000 mm or between about 200 mm and about 500 mm (e.g., 250 mm), and may have a diameter between about 0.02 mm and about 0.5 mm or between about 0.03 mm and about 0.1 mm (e.g., 0.06 mm). The corona wire 510 may be fixed within the space of the support frame or housing 530 so that the corona wire 510 is linear or substantially linear across its length. In some implementations, the length of the corona wire 510 is at least 40% longer than one or more dimensions of the substrate, where the one or more dimensions of the substrate may include a length and a width of the substrate. The length and the width of the substrate may be evaluated along directions perpendicular to each other in a plane coplanar with the major surface of the substrate.

In some implementations, the corona source may include a plurality of corona wires. FIG. 6 is a schematic illustration showing a bottom view of an example corona source including a linear array of corona wires according to some implementations. In FIG. 6, the corona source 600 includes a plurality of corona wire devices, each with a corona wire 610 within a support frame or housing 630. In some implementations, the corona wires 610 are suspended within a space in the support frame or housing 630. The corona source 600 may further include a grid electrode 620, where the grid electrode includes a plurality of through-holes. The grid electrode 620 may be positioned below the plurality of corona wires 610 and parallel to a major plane or surface of a substrate, where the substrate includes a piezoelectric layer. The corona source 600 includes a linear array of multiple corona wires 610, each of the corona wires 610 being parallel or substantially parallel to one another with respect to its longitudinal axis. Each of the corona wires 610 may be coplanar or substantially coplanar to one another. More corona wires 610, and/or a higher density of corona wires 610, in the corona source 600 may increase throughput and uniformity in poling operations. Though the corona source 600 shows 9 corona wires 610 arranged in an array, fewer corona wires 610 may be desirable (e.g. between 2-8 corona wires). Furthermore, each of the corona wires 610 may be uniformly or substantially uniformly spaced apart. For example, each of the corona wires 610 may be laterally spaced apart between about 10 mm and about 300 mm. Without being limited by any theory, air gaps between the corona wires 610 may facilitate increased recirculation for improved uniformity of corona discharge. In some implementations, the corona source 600 includes an odd number of corona wires 610. An odd number of corona wires 610 may be used with rotational stages to avoid non-poled regions in the center of the substrate. Aside from having only a single corona wire, various aspects discussed above of the corona source 500 with a single corona wire 510 in FIGS. 5A-5B apply to the corona source 600 for the linear array of corona wires 610 in FIG. 6.

Activation of the corona sources described in FIGS. 2A-2B, 3, 4, 5A-5B, and 6 results in a high-voltage electric field that is induced between the corona source and an electrical ground. The high-voltage electric field ionizes the surrounding gases to generate a corona discharge including electrons, negative ions, positive ions, and neutral species. With a high electric potential between the corona source and the electrical ground, charged species of appropriate polarity accelerate towards the electrical ground. This causes the charged species (e.g., negative ions) to temporarily reside at a surface of a substrate with a piezoelectric layer to generate a strong electric field to pole the piezoelectric layer.

Figure 7:
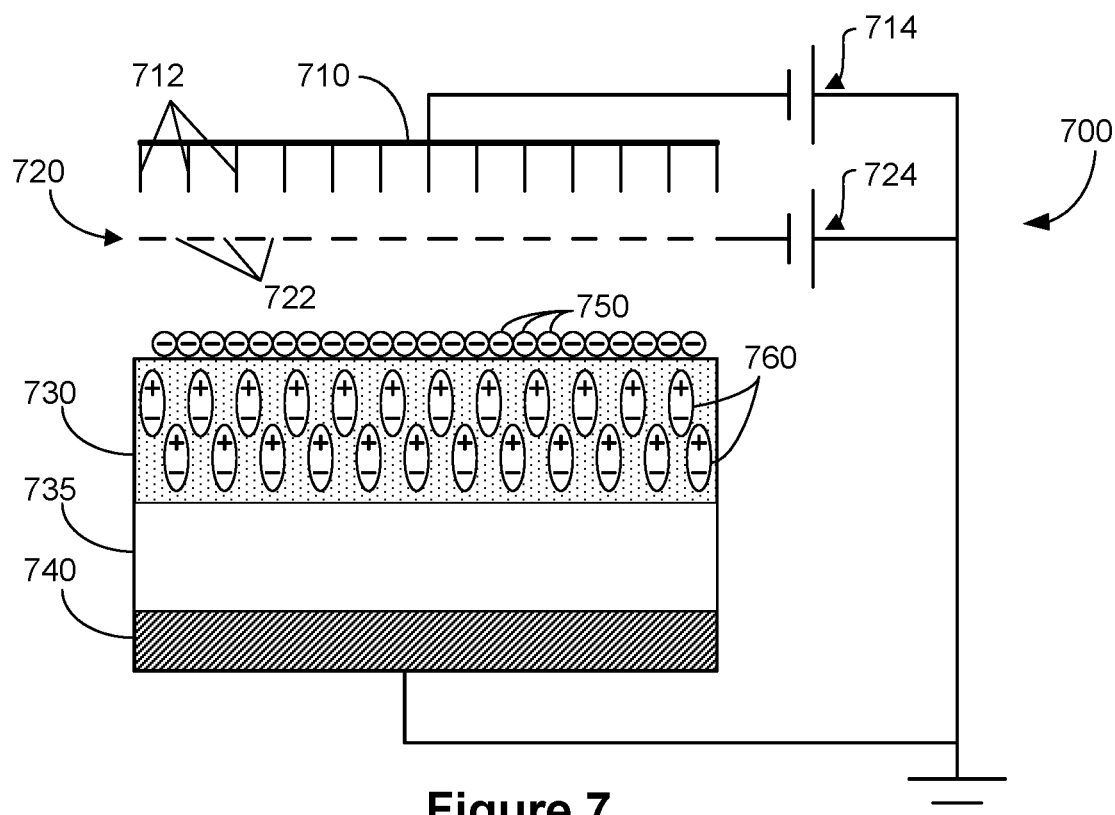
FIG. 7 shows a block diagram representation of an apparatus including a corona source with an array of pins for transferring a corona discharge onto a substrate with a piezoelectric film according to some implementations.

FIG. 7 shows a block diagram representation of an apparatus including a corona source with an array of pins for transferring a corona discharge onto a substrate with a piezoelectric film according to some implementations. The apparatus 700 includes a corona source 710 with an array of pins 712. Aspects of the array of pins 712 are described above with respect to FIGS. 2A-2B, 3, and 4. The corona source 710 is positioned over a substrate 735 with a piezoelectric layer 730, where the corona source 710 is configured to transfer a corona discharge onto a major surface of the substrate 735 to pole the piezoelectric layer 730. As shown in FIG. 7, the piezoelectric layer 730 may have a plurality of electric or crystal dipoles 760. The substrate 735 may be supported on a substrate support 740, where the substrate 735 is over the substrate support 740. Each of the pins 712 may have a longitudinal axis that is largely perpendicular to a major surface of the substrate 735 and/or a substantially planar surface of the substrate support 740. The major surface of the substrate 735 may be facing towards the corona source 710, where the major surface of the substrate 735 may be defined by a horizontal plane on which the substrate 735 is supported.

The apparatus 700 further includes a grid electrode 720 interposed between the corona source 710 and the substrate 735, or at least interposed between the corona source 710 and the substrate support 740. In some implementations, a distance between the substrate support 740 and the grid electrode 720 is between about 2 mm and about 5 mm. The poling effect of the corona source 710 may depend in part on the distance between the grid electrode 720 and the substrate 735. The grid electrode 720 may include a plurality of through-holes 722. The grid electrode 720 may be parallel to the major surface of the substrate 735 and/or the substantially planar surface of the substrate support 740.

In some implementations, the substrate support 740 may serve as a ground electrode. For example, the substrate support 740 may be made of an electrically conductive material (e.g., aluminium) to serve as a ground electrode. In some implementations, the substrate support 740 is electrically connected to a ground electrode, where the ground electrode is a separate component from the substrate support 740. In some implementations, the substrate 735 may include electrical circuitry or an electrode to serve as a ground electrode. In such instances, one or more electrodes underneath the piezoelectric layer 730 of the substrate 735 may be used as a ground electrode. In a piezoelectric device, a piezoelectric layer 730 may be sandwiched between two electrodes. When a poling operation is performed during manufacture of the piezoelectric device, at least one of the electrodes may be formed (e.g., an electrode between the substrate support 740 and the piezoelectric layer 730 of the substrate 735) and at least one of the electrodes may serve as the ground electrode during poling. In some implementations, the substrate 735 may include an electrically conductive or semiconducting material (e.g., silicon) and the substrate 735 may serve as the ground electrode.

In some implementations, one or both of the substrate support 740 and the corona source 710 may be movable relative to one another. The apparatus 700 may further include a mechanism (not shown) that is configured to produce relative motion between the substrate 735 and the corona source 710. Such relative motion may include linear translation motion and/or rotational motion. Producing such relative motion between the substrate 735 and the corona source 710 may reduce non-uniformities, such as non-uniformities in a piezoelectric coefficient $d_{33}$, arising from the corona discharge produced over the surface of the substrate 735. Aspects of a mechanism for producing such relative motion are described below with reference to FIGS. 9A-9D, 10, and 11.

In some implementations, the apparatus 700 further includes a first voltage source 714, where the first voltage source 714 is electrically connected to the corona source 710. When activated, the first voltage source 714 is configured to induce a first voltage relative to the substrate support 740 or a ground electrode. The first voltage source 714 may be a high-voltage power source capable of providing between about 4 kV and about 40 kV or more of potential between the corona source 710 and the ground electrode when activated. In some implementations, the first voltage may be between about 7 kV and about 16 kV relative to the ground electrode. It will be understood that even though the first voltage may be expressed as a positive number, the first voltage is generally supplied by negative voltage supplies.

In some implementations, the apparatus 700 further includes a second voltage source 724, where the second voltage source 724 is electrically connected to the grid electrode 720. When activated, the second voltage source 724 is configured to induce a second voltage relative to the substrate support 740 or a ground electrode. The second voltage source 724 may be a high-voltage power source capable of providing between about 1 kV and about 10 kV or more of potential between the grid electrode 720 and the ground electrode when activated. In some implementations, the second voltage may be between about 1 kV and about 10 kV relative to the ground electrode. It will be understood that even though the second voltage may be expressed as a positive number, the second voltage is generally supplied by negative voltage supplies. In some implementations, the second voltage may be less (i.e., less negative) than the first voltage.

Activation of the corona source 710 produces a high electric field between the corona source 710 and the electrical ground (e.g., substrate support 740) that ionizes surrounding gases. When the surrounding gases (e.g., dry air) are ionized by the array of pins 712, a corona discharge is produced including ionized gas molecules. Activation of the grid electrode 720 serves to preferentially draw negatively charged ions towards and through the grid electrode 720, particularly through the through-holes 722 of the grid electrode 720. This prevents or minimizes positively charged ions from depositing onto a surface of the substrate 735. Through the use of the grid electrode 720, a ratio of the negatively charged ions and electrons resulting from the corona discharge that may deposit on the surface of the substrate 735 to the positively charged ions resulting from the corona discharge that may deposit on the surface of the substrate 735 may be controlled. A lower or less negative voltage may be applied to the grid electrode 720 to select negatively charged ions and accelerate such negatively charged ions towards the surface of the substrate 735. Thus, as shown in FIG. 7, a layer of negatively charged ions 750 may be deposited on the surface of the substrate 735 facing the corona source 710. The layer of negatively charged ions 750 may generate a strong electric field to pole the piezoelectric layer 730 of the substrate 735. Without being limited by any theory, the strong electric field from the layer of negatively charged ions 750 causes the positive poles of the electric or crystal dipoles 760 to orient towards the surface of the substrate 735 facing the corona source 710. Hence, the negative poles of the electric or crystal dipoles 760 are oriented away from the surface of the substrate 735 facing the corona source 710. The magnitude of the negative charge from the layer of negatively charged ions 750 may be controlled by controlling the second voltage applied to the grid electrode 720, thereby increasing or decreasing the electric field for poling the piezoelectric layer 730.

Though the apparatus 700 for poling a piezoelectric layer 730 illustrates a piezoelectric layer 730 disposed on a substrate 735, it will be understood that in some implementations, the piezoelectric layer 730 may be disposed directly on the substrate support 740 without a separate layer of substrate 735 therebetween. Specifically, the apparatus 700 may serve to pole the piezoelectric layer 730 without the substrate 735.

Figure 8:
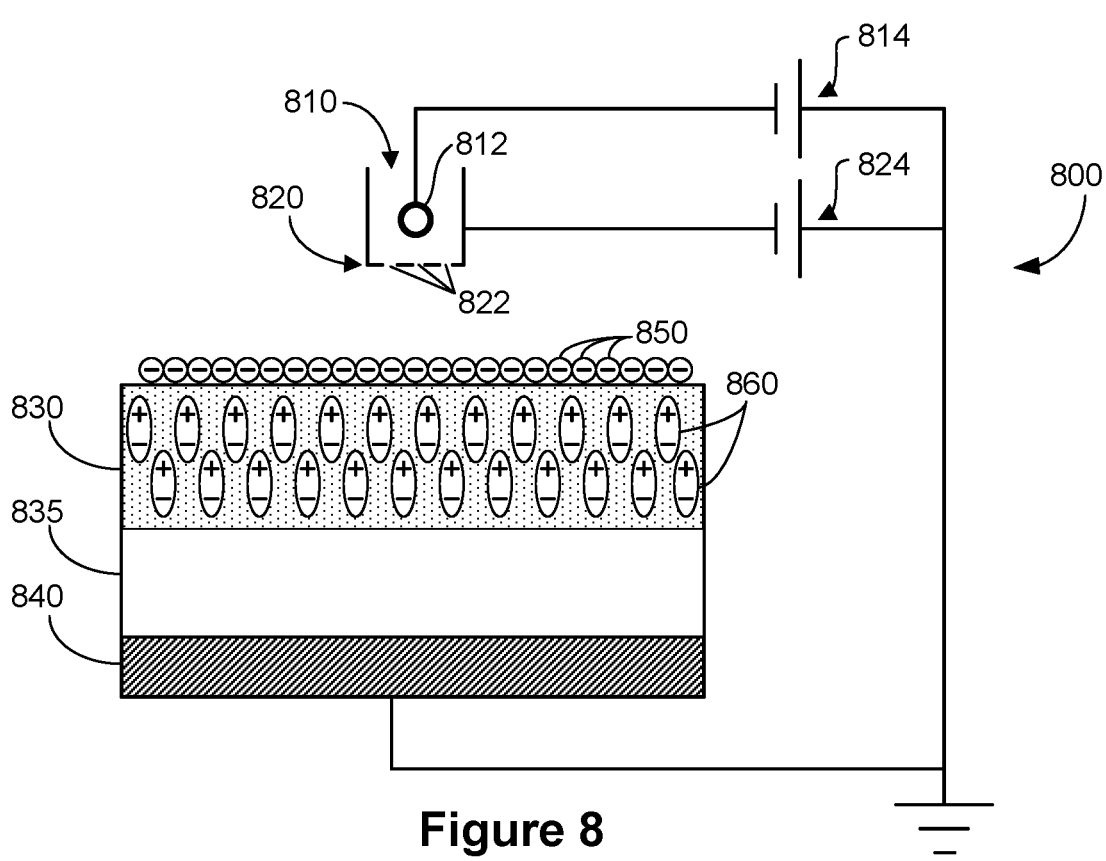
FIG. 8 shows a block diagram representation of an apparatus including a corona source with a corona wire for transferring a corona discharge onto a substrate with a piezoelectric film according to some implementations.

FIG. 8 shows a block diagram representation of an apparatus including a corona source with a corona wire for transferring a corona discharge onto a substrate with a piezoelectric film according to some implementations. The apparatus 800 includes a corona source 810 with one or more corona wires 812. Though the corona source 810 is shown with a single corona wire 812, it will be understood that the corona source 810 may include a plurality of corona wires 812. Aspects of corona wires 812 are described above with respect to FIGS. 5A-5B and 6. The corona source 810 is positioned over a substrate 835 with a piezoelectric layer 830, where the corona source 810 is configured to transfer a corona discharge onto a major surface of the substrate 835 to pole the piezoelectric layer 830. As shown in FIG. 8, the piezoelectric layer 830 may have a plurality of electric or crystal dipoles 860. The substrate 835 may be supported on a substrate support 840, where the substrate 835 is over the substrate support 840. Each of the corona wires 812 extends along an axis parallel to a major surface of the substrate 835 and/or a substantially planar surface of the substrate support 840. The major surface of the substrate 835 may be facing towards the corona source 810, where the major surface of the substrate 835 may be defined by a horizontal plane on which the substrate 835 is supported.

The apparatus 800 further includes a grid electrode 820 interposed between the corona source 810 and the substrate 835, or at least interposed between the corona source 810 and the substrate support 840. In some implementations, a distance between the substrate support 840 and the grid electrode 820 is between about 2 mm and about 5 mm. The poling effect of the corona source 810 may depend in part on the distance between the grid electrode 820 and the substrate 835. The grid electrode 820 may include a plurality of through-holes 822. The grid electrode 820 may be parallel to the major surface of the substrate 835 and/or the substantially planar surface of the substrate support 840.

In some implementations, the substrate support 840 may serve as a ground electrode. For example, the substrate support 840 may be made of an electrically conductive material (e.g., aluminium) to serve as a ground electrode. In some implementations, the substrate support 840 is electrically connected to a ground electrode, where the ground electrode is a separate component from the substrate support 840. In some implementations, the substrate 835 may include electrical circuitry or an electrode to serve as a ground electrode. In such instances, one or more electrodes underneath the piezoelectric layer 830 of the substrate 835 may be used as a ground electrode. In a piezoelectric device, a piezoelectric layer 830 may be sandwiched between two electrodes. When a poling operation is performed during manufacture of the piezoelectric device, at least one of the electrodes may be formed (e.g., an electrode between the substrate support 840 and the piezoelectric layer 830 of the substrate 835) and at least one of the electrodes may serve as the ground electrode during poling. In some implementations the substrate 835 may include an electrically conductive or semiconducting material (e.g., silicon) and the substrate 835 may serve as the ground electrode.

In some implementations, one or both of the substrate support 840 and the corona source 810 may be movable relative to one another. The apparatus 800 may further include a mechanism (not shown) that is configured to produce relative motion between the substrate 835 and the corona source 810. Such relative motion may include linear translation motion and/or rotational motion. Producing such relative motion between the substrate 835 and the corona source 810 may reduce non-uniformities, such as non-uniformities in piezoelectric coefficient $d_{33}$, arising from the corona discharge produced over the surface of the substrate 835. Aspects of a mechanism for producing such relative motion are described below with reference to FIGS. 9A-9D, 10, and 11.

In some implementations, the apparatus 800 further includes a first voltage source 814, where the first voltage source 814 is electrically connected to the corona source 810. When activated, the first voltage source 814 is configured to induce a first voltage relative to the substrate support 840 or a ground electrode. The first voltage source 814 may be a high-voltage power source capable of providing between about 4 kV and about 40 kV or more of potential between the corona source 810 and the ground electrode when activated. In some implementations, the first voltage may be between about 7 kV and about 16 kV relative to the ground electrode. It will be understood that even though the first voltage may be expressed as a positive number, the first voltage is generally supplied by negative voltage supplies.

In some implementations, the apparatus 800 further includes a second voltage source 824, where the second voltage source 824 is electrically connected to the grid electrode 820. When activated, the second voltage source 824 is configured to induce a second voltage relative to the substrate support 840 or a ground electrode. The second voltage source 824 may be a high-voltage power source capable of providing between about 1 kV and about 10 kV or more of potential between the grid electrode 820 and the ground electrode when activated. In some implementations, the second voltage may be between about 1 kV and about 10 kV relative to the ground electrode. It will be understood that even though the second voltage may be expressed as a positive number, the second voltage is generally supplied by negative voltage supplies. In some implementations, the second voltage may be less (i.e., less negative) than the first voltage.

Activation of the corona source 810 produces a high electric field between the corona source 810 and the electrical ground (e.g., substrate support 840) that ionizes surrounding gases. When the surrounding gases (e.g., dry air) are ionized by the one or more corona wires 812, a corona discharge is produced including ionized gas molecules. Activation of the grid electrode 820 serves to preferentially draw negatively charged ions towards and through the grid electrode 820, particularly through the through-holes 822 of the grid electrode 820. This prevents or minimizes positively charged ions from depositing onto a surface of the substrate 835. Through the use of the grid electrode 820, a ratio of the negatively charged ions and electrons resulting from the corona discharge that may deposit on the surface of the substrate 835 to the positively charged ions resulting from the corona discharge that may deposit on the surface of the substrate 835 may be controlled. A lower or less negative voltage may be applied to the grid electrode 820 to select negatively charged ions and accelerate such negatively charged ions towards the surface of the substrate 835. Thus, as shown in FIG. 8, a layer of negatively charged ions 850 may be deposited on the surface of the substrate 835 facing the corona source 810. The layer of negatively charged ions 850 may generate a strong electric field to pole the piezoelectric layer 830 of the substrate 835. Without being limited by any theory, the strong electric field from the layer of negatively charged ions 850 causes the positive poles of the electric or crystal dipoles 860 to orient towards the surface of the substrate 835 facing the corona source 810. Hence the negative poles of the electric or crystal dipoles 860 are oriented away from the surface of the substrate 835 facing the corona source 810. The magnitude of the negative charge from the layer of negatively charged ions 850 may be controlled by controlling the second voltage applied to the grid electrode 820, thereby increasing or decreasing the electric field for poling the piezoelectric layer 830.

Though the apparatus 800 for poling a piezoelectric layer 830 illustrates a piezoelectric layer 830 disposed on a substrate 835, it will be understood that in some implementations, the piezoelectric layer 830 may be disposed directly on the substrate support 840 without a separate layer of substrate 835 therebetween. Specifically, the apparatus 800 may serve to pole the piezoelectric layer 830 without the substrate 835.

Various factors may influence the uniformity and throughput of poling a piezoelectric layer in a corona poling system. Such factors may include but are not limited to: grid voltage, corona voltage, corona current, distance between a grid electrode and a substrate with the piezoelectric layer, distance between a corona source and the grid electrode, spacing between corona wires or pins, number of corona wires or pins, geometric arrangement of corona wires or pins, relative dimensions (e.g., length and diameter) of the corona wires or pins, density and size of through-holes in the grid electrode, orientation of the corona source relative to the substrate, positioning of the corona source relative to the substrate. Other factors that may influence the uniformity and throughput of poling a piezoelectric layer may include temperature, pressure, humidity, gas mixture and flow. Various controls in a corona poling system may optimize the aforementioned factors. In some implementations, for example, the corona poling system may include a heating source for temperature control that can speed up the poling operation. The heating source may be coupled to the substrate support and configured to heat up the substrate support, or the heating source may be positioned above the substrate support and configured to apply infrared radiation to the substrate.

Additional or other controls in the corona poling system may serve to optimize throughput and uniformity of poling a piezoelectric layer with minimal damage to the substrate. For example, the corona poling system may include passive components, ammeters, voltmeters, and temporal ramps of the voltage supplies during initiation of the corona discharge, which can be used to monitor and stabilize the grid voltage and corona discharge. By slowly ramping up or controlling voltage supplies so that the corona discharge is not uncontrolled, electrostatic damage to the substrate is prevented or minimized. For example, with respect to FIG. 7, the apparatus 700 includes a first voltage source 714 and a second voltage source 724, where one or both of the first voltage source 714 and the second voltage source 724 is configured to ramp up to a first voltage and a second voltage, respectively. Likewise, with respect to FIG. 8, the apparatus includes a first voltage source 814 and a second voltage source 824, where one or both of the first voltage source and the second voltage source 824 is configured to ramp up to a first voltage and a second voltage, respectively.

Introduction of relative motion between a substrate and the corona source may further reduce non-uniformities, such as non-uniformities in piezoelectric constant $d_{33}$, that may arise in poling a piezoelectric layer. This may be accomplished through a number of mechanisms.

FIGS. 9A-9D are schematic illustrations of different examples of apparatuses with mechanisms configured to produce various types of relative motion between a substrate and a corona source. However, it will be understood that the relative motion between a substrate and a corona source is not limited to the examples shown in FIGS. 9A-9D, but may include different types of motion as well as different combinations of motion. In FIGS. 9A-9D, each of the apparatuses 900a, 900b, 900c, and 900d includes a corona source 910 positioned over a substrate support 930 for supporting a substrate 932. The substrate support 930 may have a planar or substantially planar surface. In some implementations, the substrate support 930 is connected to an electrical ground 934. The corona source 910 may include a plurality of corona wires 912 arranged in an array. However, it will be understood that the corona source 910 may include an array of pins instead of corona wires 912 or may include a single corona wire 912 instead of an array of corona wires 912. Each of the apparatuses 900a, 900b, 900c, and 900d further includes a grid electrode 920 positioned between the corona source 910 and the substrate support 940. Each of the apparatuses 900a, 900b, 900c, and 900d includes a mechanism coupled to one or both of the substrate support 930 and the corona source 910, where the mechanism is configured to produce relative motion between the substrate 932 and the corona source 910. Relative motion may be systematic, random, or a combination of systematic and random motion.

Figure 9A:
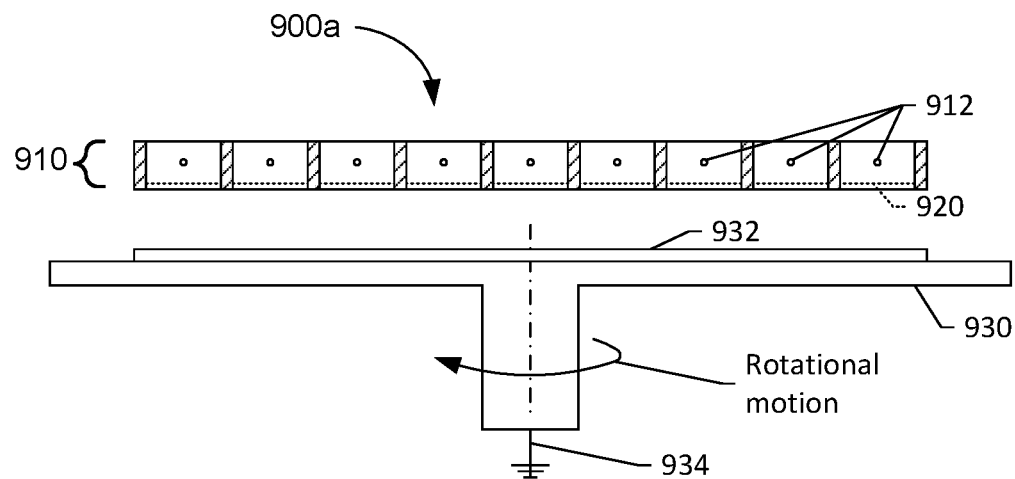
FIG. 9A is a schematic illustration of an example apparatus including a substrate support configured to rotate according to some implementations.

FIG. 9A is a schematic illustration of an example apparatus including a substrate support configured to rotate according to some implementations. In the apparatus 900a of FIG. 9A, the mechanism is coupled to at least the substrate support 930 so that the substrate support 930 is rotatable, where the substrate support 930 may be a rotary stage or turntable. The substrate support 930 is configured to rotate about an axis perpendicular to the major surface of the substrate 932 and/or the substantially planar surface of the substrate support 930. In FIG. 9A, the corona source 910 may be stationary. Accordingly, the substrate support 930 may rotate about the axis perpendicular to the major surface of the substrate 932 and/or the substantially planar surface of the substrate support 930 while the corona source 910 is discharging. The substrate 932 may be rotated before, during, and/or after a poling operation. This may improve the uniformity of poling a piezoelectric layer of the substrate 932.

Figure 9B:
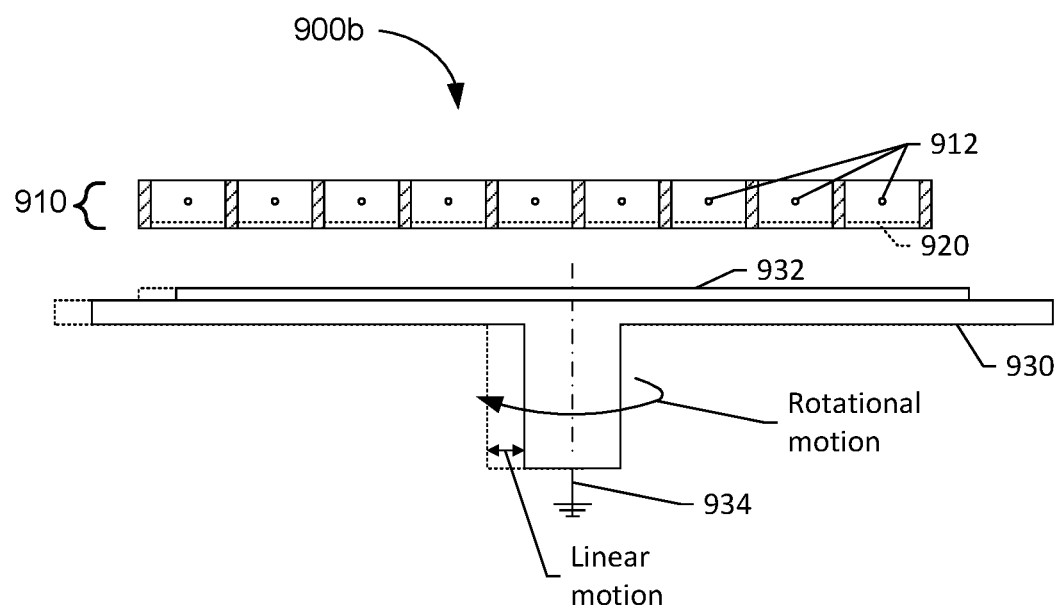
FIG. 9B is a schematic illustration of an example apparatus including a substrate support configured to rotate and translate according to some implementations.

FIG. 9B is a schematic illustration of an example apparatus including a substrate support configured to rotate and translate according to some implementations. In the apparatus 900b of FIG. 9B, the mechanism is coupled to at least the substrate support 930 so that the substrate support 930 is rotatable and translatable. The mechanism can include a rotary stage for rotating the substrate 932 and a linear translation system for causing linear translation of the substrate 932. Where a corona poling system features rotational movement, there may be concentric "banding" effects that result from non-uniformities arising from the corona source 910 or the substrate support 930 rotating about a fixed center point. By introducing a translational mechanism that allows the fixed center point to be varied, the concentric banding effects may be reduced or eliminated. In FIG. 9B, the substrate support 930 is configured to rotate about an axis perpendicular to the major surface of the substrate 932 and/or the substantially planar surface of the substrate support 930. The substrate support 930 is also configured to translate linearly (e.g., left-to-right or right-to-left) along a direction parallel to the major surface of the substrate 932 and/or the substantially planar surface of the substrate support 930. In some implementations, the substrate support 930 is configured to "dither" by translating in a back-and-forth motion. When dithering, the substrate support 930 may translate back-and-forth laterally by a distance equivalent to, for example, less than one to two spacing distances between pins in a pin-grid array (if used) or less than a distance between two adjacent corona wires in an array of corona wires (if used). In FIG. 9B, the corona source 910 may be stationary. Thus, the substrate support 930 may rotate about the axis perpendicular to the major surface of the substrate 932 and/or the substantially planar surface of the substrate support 930 as well as traverse laterally back-and-forth while the corona source 910 is discharging. The substrate 932 may be rotated and/or translated before, during, and/or after a poling operation. This may improve the uniformity of poling a piezoelectric layer of the substrate 932. Though FIG. 9B illustrates both rotational and translational motion, it will be understood that the apparatus 900b may be configured to provide translational motion without rotational motion to improve uniformity of poling.

Figure 9C:
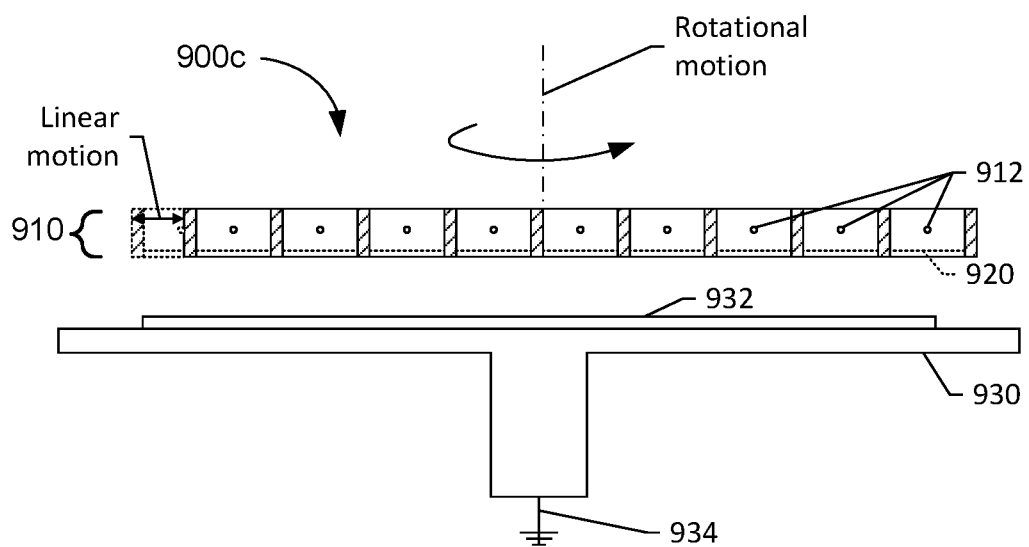
FIG. 9C is a schematic illustration of an example apparatus including a corona source configured to rotate and translate according to some implementations.

FIG. 9C is a schematic illustration of an example apparatus including a corona source configured to rotate and translate according to some implementations. In the apparatus 900c of FIG. 9C, the mechanism is coupled to at least the corona source 910 so that the corona source 910 is rotatable and translatable, such as having the corona source 910 held in a rotatable and translatable frame or housing. The corona source 910 is configured to rotate about an axis perpendicular to the major surface of the substrate 932 and/or the substantially planar surface of the substrate support 930. The corona source 910 is also configured to translate linearly (e.g., left-to-right or right-to-left) along a direction parallel to the major surface of the substrate 932 and/or the substantially planar surface of the substrate support 930. In some implementations, the corona source 910 is configured to "dither" by translating in a back-and-forth motion. Thus, in some implementations, the mechanism may include a rotary stage and a linear translation system. In FIG. 9C, the substrate support 930 may be stationary. The corona source 910 may rotate and/or translate before, during, and/or after a poling operation. When the corona source 910 is moving and discharging, this may improve the uniformity of poling the piezoelectric layer of the substrate 932. Though FIG. 9C illustrates both rotational and translational motion, it will be understood that the apparatus 900c may be configured to provide translational motion without rotational motion or rotational motion without translational motion to improve uniformity of poling.

Figure 9D:
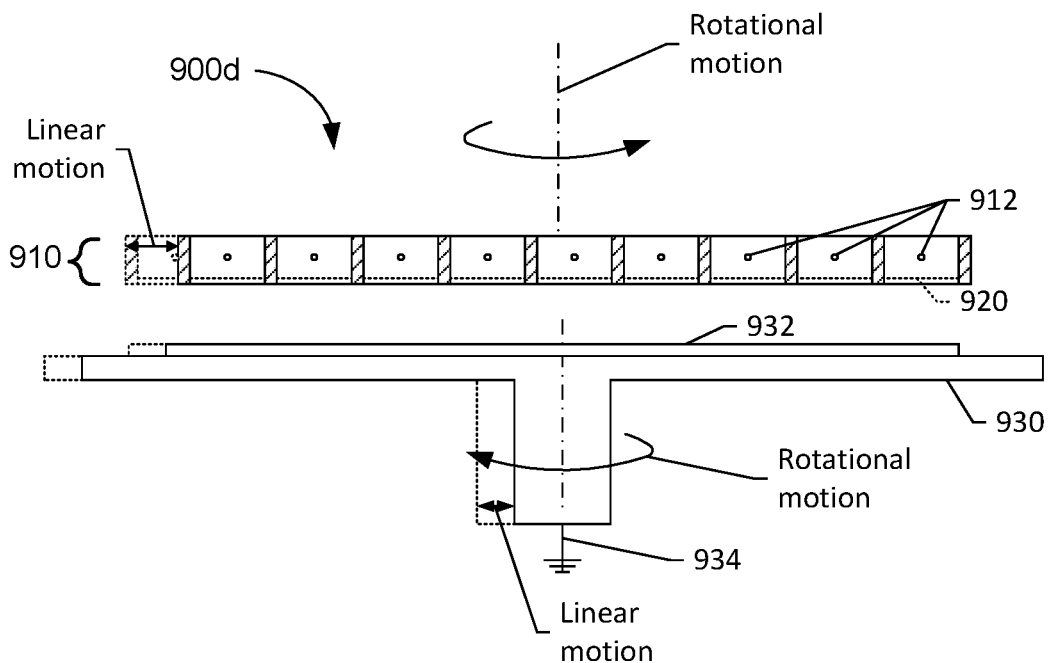
FIG. 9D is a schematic illustration of an example apparatus including a corona source configured to rotate and translate as well as a substrate support configured to rotate and translate according to some implementations.

FIG. 9D is a schematic illustration of an example apparatus including a corona source configured to rotate and translate as well as a substrate support configured to rotate and translate according to some implementations. Whereas apparatuses 900a, 900b, and 900c in FIGS. 9A-9C, respectively, include a stationary substrate support 930 or a stationary corona source 910, neither the substrate support 930 nor the corona source 910 is stationary in the apparatus 900d of FIG. 9D. The mechanism in the apparatus 900d may be coupled to both the substrate support 930 and the corona source 910. The substrate support 930 may be configured to rotate about an axis perpendicular to the major surface of the substrate 932 and/or the substantially planar surface of the substrate support 930 as well as linearly translate along a direction parallel to the major surface of the substrate 932 and/or the substantially planar surface of the substrate support 930. However, it will be understood that in some implementations, the substrate support 930 may be configured to rotate and not translate or translate and not rotate. The corona source 910 may be configured to rotate about an axis perpendicular to the major surface of the substrate 932 and/or the substantially planar surface of the substrate support 930 as well as linearly translate along a direction parallel to the major surface of the substrate 932 and/or the substantially planar surface of the substrate support 930. However, it will be understood that in some implementations, the corona source 910 may be configured to rotate and not translate or translate and not rotate. Movement of the corona source 910 and/or substrate support 930 may occur before, during, and/or after a poling operation. Accordingly, improvement in uniformity of poling the piezoelectric layer of the substrate 932 may be achieved with a movable substrate support 930 and a movable corona source 910.

Figure 10:
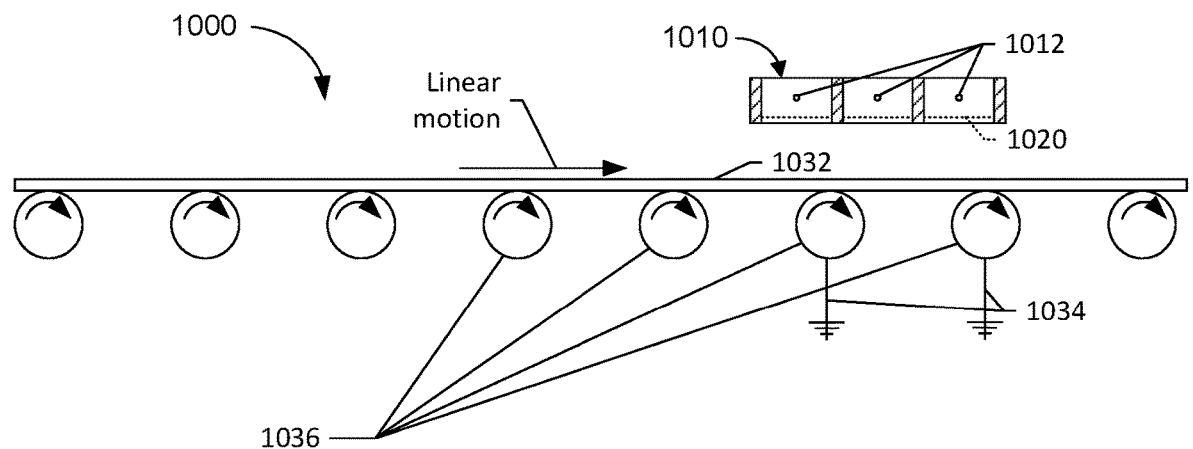
FIG. 10 is a schematic illustration of an example apparatus including a corona source over a substrate and a rolling mechanism for linearly translating the substrate according to some implementations.

FIG. 10 is a schematic illustration of an example apparatus including a corona source over a substrate and a rolling mechanism for linearly translating the substrate according to some implementations. In FIG. 10, the apparatus 1000 includes a corona source 1010 and a system through which a substrate 1032 is fed. Such a system may include a linear conveyor system having a plurality of rollers 1036 through which a substrate 1032 is fed. The plurality of rollers 1036 may facilitate linear translation of the substrate 1032 so that more surface area of the substrate 1032 may be subject to the corona source 1010. The substrate 1032 may make a single pass or may reverse direction and make multiple passes for multiple exposures to the corona source 1010. The apparatus 1000 that facilitates linear translation for feeding the substrate 1032 through may be useful for very large-area substrates and panels. Where rotational motion is insufficient or impractical, or where the substrate 1032 requires considerable floor space, such a system shown in the apparatus in FIG. 10 may be implemented for linear translation of the substrate 1032 relative to the corona source 1010. In some implementations, such a system for feeding the substrate 1032 may be used in roll-to-roll manufacturing.

In some implementations, the substrate 1032 is supported on a substrate support (not shown), where the substrate support is provided through the plurality of rollers 1036. In some implementations, the substrate 1032 is directly provided through the plurality of rollers 1036. One or more rollers 1036 may be connected to an electrical ground 1034. As the substrate 1032 is provided through the plurality of rollers 1036, the substrate 1032 is subjected to a corona discharge from the corona source 1010 to pole a piezoelectric layer of the substrate 1032. The corona source 1010 may include a plurality of corona wires 1012 and a grid electrode 1020 between the corona source 1010 and the substrate 1032. However, it will be understood that the corona source 1010 may include an array of pins instead of the plurality of corona wires 1012.

Figure 11:
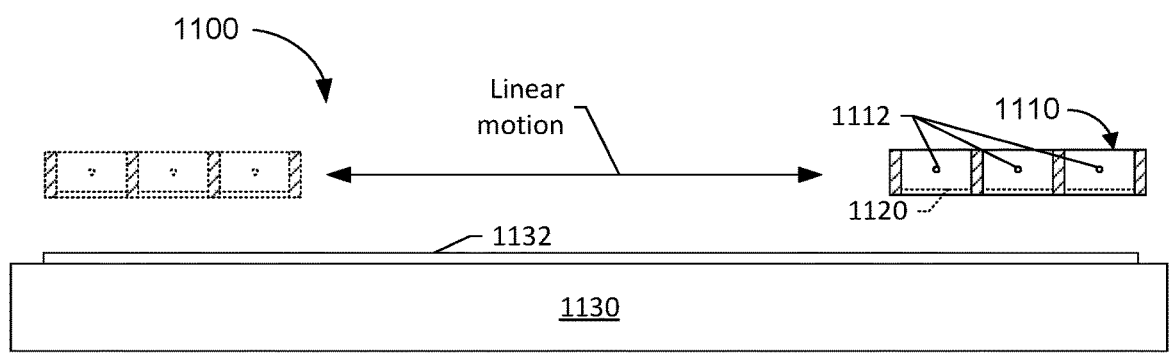
FIG. 11 is a schematic illustration of an example apparatus including a substrate on a stationary substrate support and a corona source capable of linearly translating over the substrate according to some implementations.

FIG. 11 is a schematic illustration of an example apparatus including a substrate on a stationary substrate support and a corona source capable of linearly translating over the substrate according to some implementations. In FIG. 11, the apparatus 1100 includes a corona source 1110 and a system for translating the corona source 1110 along a length of the substrate 1132. The substrate 1132 may remain stationary and supported on a substrate support 1130. Rather than moving the substrate 1132, a translation mechanism may move the corona source 1110 linearly so that more surface area of the substrate 1132 is subjected to a corona discharge generated from the corona source 1110. Where rotational motion is insufficient or impractical, or where the substrate 1132 requires considerable floor space, such a system shown in the apparatus in FIG. 11 may be implemented for linear translation of the corona source 1110 relative to the substrate 1132. The corona source 1110 may include a plurality of corona wires 1112 and a grid electrode 1120 between the corona source 1110 and the substrate 1132. However, it will be understood that the corona source 1110 may include an array of pins instead of the plurality of corona wires 1112. The corona source 1110 may linearly translate in a direction perpendicular to the longitudinal axis of the corona wires 1112 where corona wires 1112 are used.

Figure 12A:
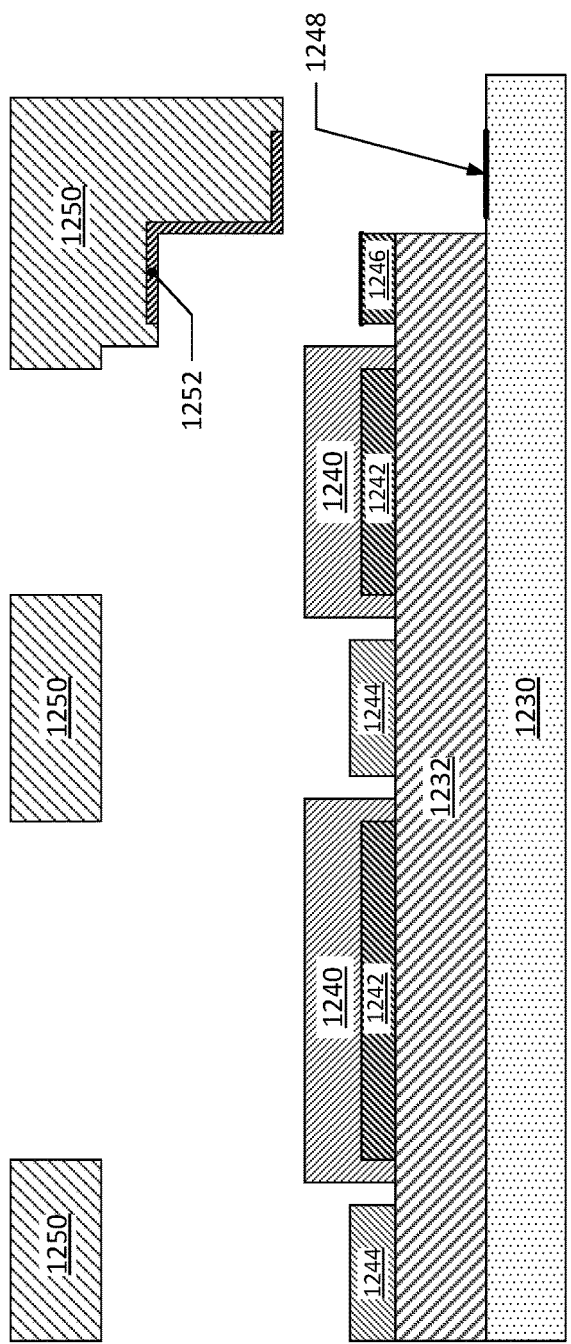
FIGS. 12A-12B are cross-sectional schematic illustrations showing a mask of a poling apparatus disposed over one or more regions of a substrate according to some implementations.
Figure 12B:
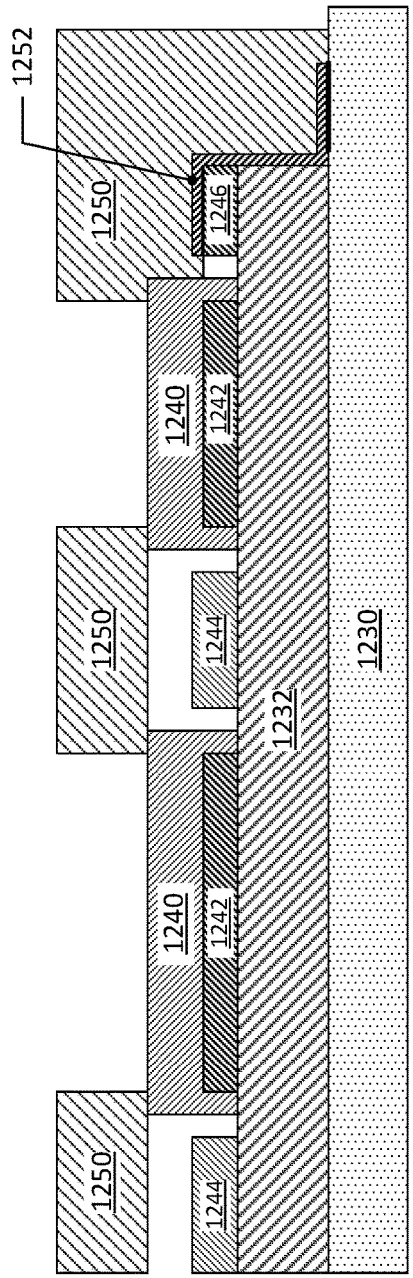

FIGS. 12A-12B are cross-sectional schematic illustrations showing a mask of a poling apparatus disposed over one or more regions of a substrate according to some implementations. A substrate 1232 may be supported on a substrate support 1230. Circuits 1242 of the substrate 1232 may be disposed on a portion of the substrate 1232, where the circuits 1242 may include various electrical circuitry of a chip. The circuits 1242 may serve as an electrode during a poling operation. A piezoelectric layer 1240, which can include PVDF or PVDF-TrFE, may be disposed on the substrate 1232. In some implementations, the piezoelectric layer 1240 may overlap with the portion of the substrate 1232 on which the circuits 1242 are disposed. In some implementations, the piezoelectric layer 1240 may form at least part of one or more ultrasonic fingerprint sensors. At a later stage of processing, the substrate 1232 may be diced and separated into discrete sensors. Prior to such processing, however, the circuits 1242 may be connected to a common circuit trace network that leads to an external ground 1248.

One or more bond pads 1244 of the substrate 1232 may be disposed on another portion of the substrate 1232 separate from the portion of the substrate 1232 on which the circuits 1242 are disposed. However, the circuits 1242 are electrically connected to the bond pads 1244. In some implementations, one of the bond pads 1244 may be a contact patch 1246 that provides an electrically conductive pathway to the external ground 1248.

A mask 1250 may be provided over the substrate 1232 to "shield" one or more masked regions of the substrate 1232. In FIG. 12A, the mask 1250 is shown lifted over the substrate 1232. In FIG. 12B, the mask 1250 is shown lowered onto the substrate 1232. The mask 1250 may cover one or more masked regions of the substrate 1232 where at least the bond pads 1244 are disposed. The mask 1250 may expose one or more unmasked regions of the substrate 1232 where the circuits 1242 are disposed. The mask 1250 may include a dielectric material such as a polyamide or other similar material. The mask 1250 may be configured to block ionized molecules of a corona discharge from reaching the one or more masked regions of the substrate 1232, including the bond pads 1244 formed thereon. The mask 1250 may be referred to as a "shadow mask" that is configured to block (or "shadow") the one or more masked regions of the substrate 1232 upon which the piezoelectric layer 1240 is not disposed. In some implementations, the mask 1250 may be a frame made of dielectric material or may include material deposited onto the substrate 1232.

The mask 1250 may serve one or more purposes. First, the mask 1250 may exclude corona discharge from charging up the bond pads 1244, which would otherwise result in the electric potential of on the bond pads 1244 and the circuits 1242 being the same or substantially the same as the electric potential on the top of the piezoelectric layer 1240. This results in a very small electric field across the piezoelectric layer 1240 and a very low piezoelectric constant $d_{33}$. In addition, the mask 1250 serves to prevent leakage of charge from the top of the piezoelectric layer 1240 to the bond pads 1244, which would otherwise result in a gradient in the electric field across the piezoelectric layer 1240 at the edge of the piezoelectric layer 1240, thereby lowering the piezoelectric constant $d_{33}$ at that location.

The path to the external ground 1248 may be provided, for example, by vias or other conductive pathways from a side of the substrate 1232 that faces a corona source to a side of the substrate 1232 that is in contact with the substrate support 1230. In some implementations, a conductive trace 1252 provides electrical interconnection between the contact patch 1246 of the substrate 1232 and the external ground 1248. The conductive trace 1252 providing such electrical interconnection may be disposed on a surface of the mask 1250 that interfaces with the substrate 1232 and the substrate support 1230.

Figure 13:
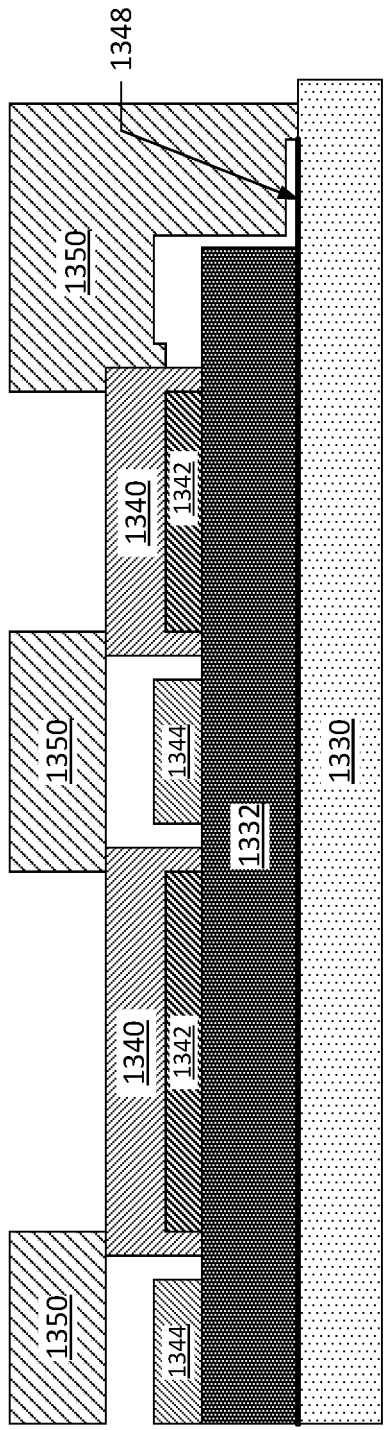
FIG. 13 is a cross-sectional schematic illustration showing a mask of a poling apparatus disposed over one or more regions of a substrate, where the substrate includes an electrically conductive or semiconducting material, according to some implementations.

The mask 1250 may be used to provide an electrical pathway from the circuits 1242 to the external ground 1248. As shown in FIG. 12B, the circuits 1242 may be under the piezoelectric layer 1240 and may be connected by conductive traces to the peripherally located contact patch 1246 on the side of the substrate 1232 facing the corona source. The mask 1250 may have a conductive trace 1252 located on the side of the mask 1250 that interfaces with the substrate 1232 and the substrate support 1230. When the mask 1250 is lowered to interface with the substrate 1232 and shield one or more masked regions of the substrate 1232 from the corona discharge, the conductive trace 1252 may provide electrical interconnection between the contact patch 1246 and the external ground 1248 on the side of the substrate 1232 that contacts the substrate support 1230. This provides a conductive bridge between the substrate 1232 and the substrate support 1230 and ensures a ground connection. In some implementations, at least a portion of the conductive trace 1252 may be formed from a conductive, compressible foam that can absorb some mechanical tolerance and positioning mismatches.

Where the substrate includes an electrically conductive material or semiconducting material, it may not be necessary to incorporate an electrically conductive pathway as shown in FIGS. 12A-12B to ensure a ground connection. FIG. 13 is a cross-sectional schematic illustration showing a mask of a poling apparatus disposed over one or more regions of a substrate, where the substrate includes an electrically conductive or semiconducting material, according to some implementations. A substrate 1332 may be supported on a substrate support 1330, where the substrate 1332 includes an electrically conductive or semiconducting material (e.g., silicon). A mask 1350 may be provided over the substrate 1332 in one or more masked regions while exposing one or more unmasked regions. The substrate 1332 may have circuits 1342 disposed in the one or more unmasked regions and may have bond pads 1344 disposed in the one or more masked regions. The substrate 1332 may also have a piezoelectric layer 1340 disposed in the one or more unmasked regions. The substrate 1332 may serve as an electrode during a poling operation. The substrate 1332 is sufficiently electrically conductive to provide a conductive bridge from the circuits 1342, which are also electrically connected to the bond pads 1344, to an external ground 1348.

Figure 14:
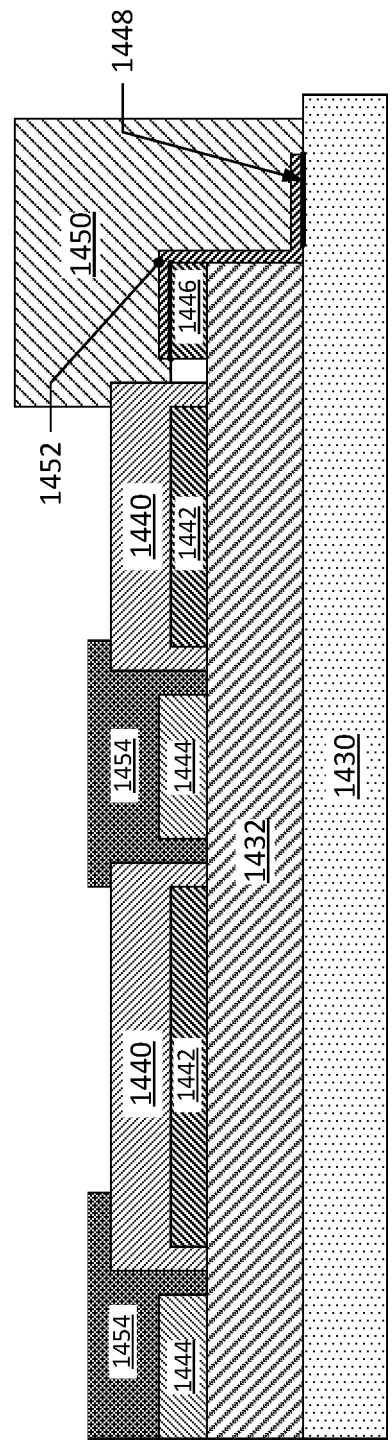
FIG. 14 is a cross-sectional schematic illustration showing a deposited resist material disposed over one or more regions of a substrate according to some implementations.

The mask for protecting one or more masked regions of a substrate may include resist material deposited on the one or more masked regions, and it may not be necessary to use a "shadow mask." FIG. 14 is a cross-sectional schematic illustration showing a deposited resist material disposed over one or more regions of a substrate according to some implementations. A substrate 1432 may be supported on a substrate support 1430. Resist material 1454 may be deposited or otherwise formed over one or more masked regions of the substrate 1432 while exposing one or more unmasked regions. The resist material 1454 may include an electrically insulating material. The substrate 1432 may have circuits 1442 disposed in the one or more unmasked regions and may have bond pads 1444 disposed in the one or more masked regions. The substrate 1432 may also have a piezoelectric layer 1440 disposed in the one or more unmasked regions. The resist material 1454 may be configured to block ionized molecules of a corona discharge from reaching the one or more masked regions of the substrate 1432, including the bond pads 1444 formed thereon. The resist material 1444 may be deposited over the substrate 1432 prior to a poling operation and may be subsequently stripped or removed after the poling operation. The substrate 1432 may also have a contact patch 1446 on a side of the substrate 1432 to electrically connect to an external ground 1448 on the substrate support 1430 via a conductive trace 1452. In some implementations, the contact patch 1446 and the conductive trace 1452 may be protected by a mask 1450, which may be positioned over a peripheral area of the substrate 1432. It will be understood that where the substrate 1432 includes an electrically conductive material or semiconducting material (e.g., silicon), the substrate 1432 may be directly electrically connected to the external ground 1448 without a contact patch 1446 and/or a conductive trace 1452 providing such electrical interconnection.

Figure 15:
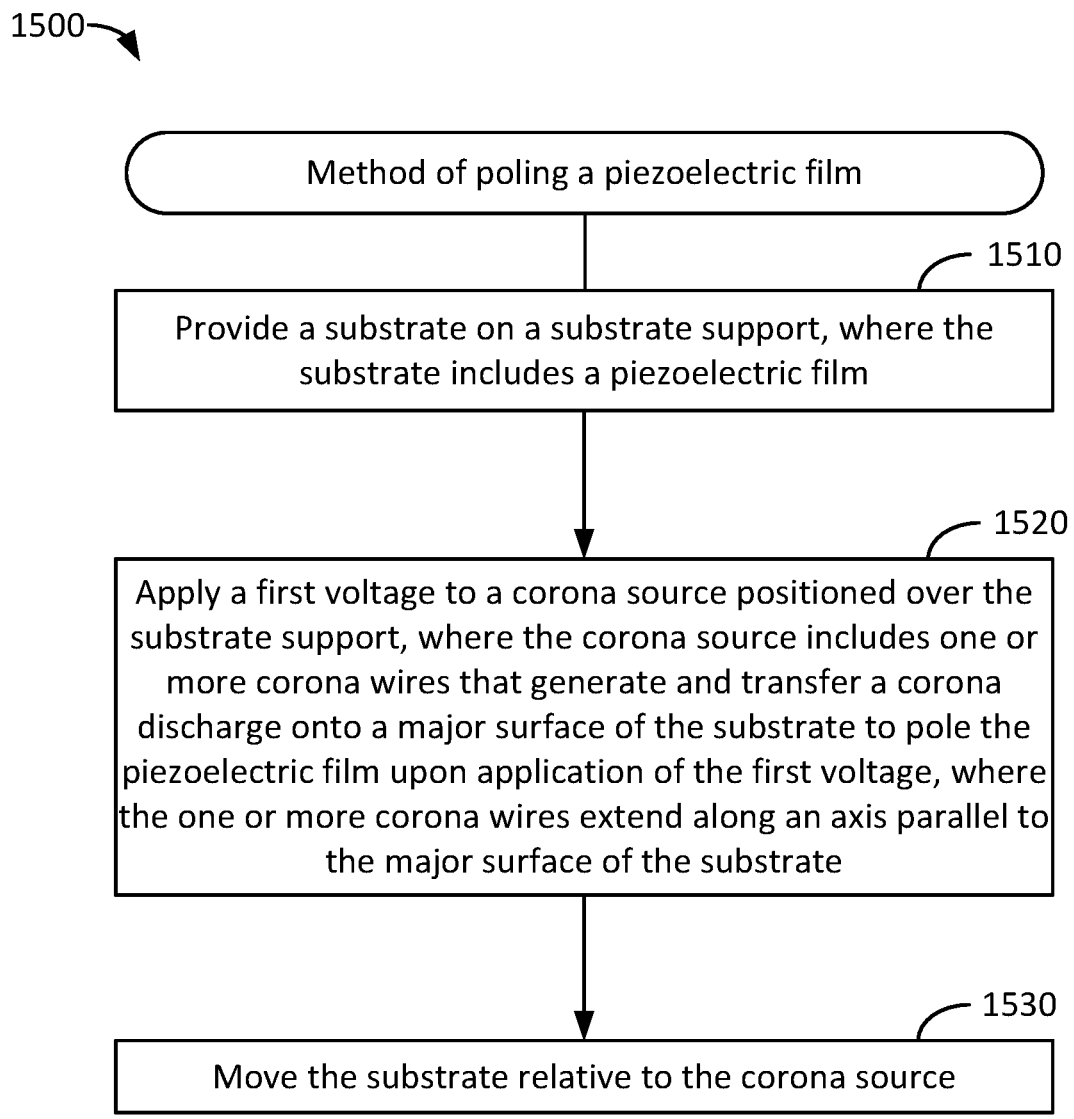
FIG. 15 shows a flow diagram illustrating an example method of poling a piezoelectric film according to some implementations.

FIG. 15 shows a flow diagram illustrating an example method of poling a piezoelectric film according to some implementations. The process 1500 may be performed in a different order or with different, fewer, or additional operations.

At block 1510 of the process 1500, a substrate is provided on a substrate support, where the substrate includes a piezoelectric film. The piezoelectric film may include any suitable piezoelectric material such as PVDF or PVDF-TrFE. The substrate may be any suitable substrate including a silicon wafer, glass substrate, silicon substrate with integrated circuitry, TFT substrate, display substrate such as LCD or OLED display substrate, or plastic substrate. However, it will be understood that in some implementations, the substrate consists of the piezoelectric film, meaning that what is provided on the substrate support is the piezoelectric film itself to be poled. In some implementations, the substrate may be a large-area substrate having a diameter or diagonal equal to or greater than about 3.5 inches. In some implementations, the substrate support serves as a ground electrode in a poling apparatus or is connected to a ground electrode.

At block 1520 of the process 1500, a first voltage is applied to a corona source positioned over the substrate support, where the corona source includes one or more corona wires that generate and transfer a corona discharge onto a major surface of the substrate to pole the piezoelectric film upon application of the first voltage. The one or more corona wires extend along an axis that is parallel to the major surface of the substrate. The major surface of the substrate may be a surface facing towards the corona source, where the major surface of the substrate may be defined by a horizontal plane on which the substrate is supported. Application of the first voltage may cause the one or more corona wires to generate the corona discharge and subsequently transfer the corona discharge onto the major surface of the substrate. In some implementations, a second voltage is applied to a grid electrode positioned between the corona source and the substrate support. The grid electrode may include a plurality of through-holes, where the grid electrode upon application of the second voltage is configured to select negatively charged ions and accelerate such negatively charged ions towards the major surface of the substrate. In some implementations, the first voltage is between about 7 kV and about 16 kV relative to the ground electrode and the second voltage is between about 1 kV and about 10 kV relative to the ground electrode. In some implementations, the one or more corona wires include a linear array of corona wires. The linear array of corona wires may be substantially uniformly spaced apart. The linear array of corona wires may also be coplanar and substantially parallel to one another.

At block 1530 of the process 1500, the substrate is moved relative to the corona source. In some implementations, moving the substrate relative to the corona source includes translating one or both of the substrate support (or substrate) and the corona source along a direction parallel to the major surface of the substrate or the substantially planar surface of the substrate support. Translation may include dithering in a back-and-forth motion of one or both of the substrate support and the corona source. In some implementations, moving the substrate relative to the corona source includes rotating one or both of the substrate support (or substrate) and the corona source about an axis perpendicular to the major surface of the substrate or the substantially planar surface of the substrate support.

In some implementations, the process 1500 further includes measuring a piezoelectric coefficient of the piezoelectric film during or after the piezoelectric film is poled. This allows a performance and activity of the poling operation to be monitored.

In some implementations, the process 1500 further includes providing a mask or a resist material over one or more masked regions of the substrate while leaving exposed one or more unmasked regions of the substrate. The one or more masked regions include regions upon which the piezoelectric film is disposed on the substrate.

In some implementations, the process 1500 further includes controlling one or more power supplies to ramp to one or both of the first voltage and the second voltage. By gradually ramping to the first voltage and/or the second voltage, electrostatic damage to the substrate may be avoided or minimized.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally in terms of functionality and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor or any conventional processor, controller, microcontroller or state machine. A processor may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, the structures disclosed in this specification and their structural equivalents thereof, or in any combination thereof. Implementations of the subject matter described in this specification may be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium, such as a non-transitory medium. The processes of a method or algorithm disclosed herein may be implemented in a processor-executable software module that may reside on a computer-readable medium. Computer-readable media include both computer storage media and communication media including any medium that may be enabled to transfer a computer program from one place to another. Storage media may be any available media that may be accessed by a computer. By way of example and not limitation, non-transitory media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those having ordinary skill in the art, and the generic principles defined herein may be applied to other implementations without departing from the spirit or scope of this disclosure. Thus, the disclosure is not intended to be limited to the implementations shown herein, but is to be accorded the widest scope consistent with the claims, the principles and the novel features disclosed herein. The word "exemplary" is used exclusively herein, if at all, to mean "serving as an example, instance or illustration." Any implementation described herein as "exemplary" is not necessarily to be construed as preferred or advantageous over other implementations.

Certain features that are described in this specification in the context of separate implementations may also be implemented in combination in a single implementation. Conversely, various features that are described in the context of a single implementation may also be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, other implementations are within the scope of the following claims. In some cases, the actions recited in the claims may be performed in a different order and still achieve desirable results.

It will be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations may be selectively combined to provide one or more comprehensive, but slightly different, technical solutions. It will therefore be further appreciated that the above description has been given by way of example only and that modifications in detail may be made within the scope of this disclosure.

What is claimed is:

1. An apparatus comprising:
   a substrate support configured to support a substrate including a piezoelectric film;
   a corona source including one or more corona wires configured to transfer a corona discharge onto a major surface of the substrate to pole the piezoelectric film, wherein the one or more corona wires extend along an axis parallel to the major surface of the substrate; and
   a mechanism coupled to at least the substrate support, wherein the mechanism is configured to rotate the substrate support to produce relative motion between the substrate and the corona source.

2. The apparatus of claim 1, further comprising:
   a grid electrode positioned between the corona source and the substrate support, wherein the grid electrode includes a plurality of through-holes.

3. The apparatus of claim 2, further comprising:
   a first voltage source electrically connected to the corona source;
   a second voltage source electrically connected to the grid electrode; and
   a ground electrode, wherein the substrate support includes the ground electrode or is electrically connected to the ground electrode.

4. The apparatus of claim 3, wherein the first voltage source is configured to induce a first voltage between about 7 kV and about 16 kV relative to the substrate support, and the second voltage source is configured to induce a second voltage between about 1 kV and about 10 kV relative to the substrate support.

5. The apparatus of claim 4, wherein one or both of the first voltage source and the second voltage source is configured to ramp up to the first voltage and the second voltage, respectively.

6. The apparatus of claim 2, wherein a distance between the grid electrode and the substrate support is between about 2 mm and about 5 mm.

7. The apparatus of claim 2, wherein the grid electrode is parallel with the major surface of the substrate.

8. The apparatus of claim 2, further comprising:
   a mask positioned between the grid electrode and the substrate support and defining one or more masked regions and one or more unmasked regions of the substrate, where the mask is configured to block the corona discharge from reaching the one or more masked regions of the substrate and expose the substrate to the corona discharge in the one or more unmasked regions of the substrate.

9. The apparatus of claim 8, wherein the mask includes a conductive trace on a surface of the mask that interfaces with the substrate support, and wherein the conductive trace is configured to provide electrical interconnection between a ground electrode and one or more circuits disposed on the substrate.

10. The apparatus of claim 1, wherein the mechanism is coupled to at least the substrate support, the mechanism including a rotary stage configured to rotate the substrate support about an axis perpendicular to the major surface of the substrate and a linear translation system configured to translate the substrate support along a direction parallel to the major surface of the substrate.

11. The apparatus of claim 1, wherein the mechanism is coupled to at least the corona source, the mechanism including one or both of a rotary stage configured to rotate the corona source about an axis perpendicular to the major surface of the substrate and a linear translation system configured to translate the corona source along a direction parallel to the major surface of the substrate.

12. The apparatus of claim 1, wherein the substrate is a large-area substrate having a diameter or diagonal equal to or greater than about 3.5 inches.

13. The apparatus of claim 1, wherein the piezoelectric film includes PVDF-TrFE copolymer.

14. The apparatus of claim 1, wherein the one or more corona wires includes a linear array of multiple corona wires, each of the corona wires being coplanar and substantially parallel to one another and being substantially uniformly spaced apart.

15. The apparatus of claim 14, wherein the corona source includes a support frame and the linear array of multiple corona wires suspended within the support frame.

16. The apparatus of claim 14, wherein the linear array of multiple corona wires includes an odd number of corona wires.

17. The apparatus of claim 1, further comprising:
    a heating source, wherein the heating source is coupled to the substrate support and configured to heat the substrate or the heating source is positioned above the substrate support and configured to apply infrared radiation to the substrate.

18. The apparatus of claim 1, wherein the substrate has a width, length, and thickness, the thickness being measured along a direction perpendicular to the major surface of the substrate, the length and the width being measured along directions orthogonal to each other and parallel to the major surface of the substrate, and wherein each of the one or more corona wires has a dimension that is at least 40% longer than one or both of the length and the width of the substrate.

19. The apparatus of claim 1, wherein the substrate consists of the piezoelectric film.

20. A method of poling a piezoelectric film, comprising:
    providing a substrate on a substrate support, wherein the substrate includes a piezoelectric film;

applying a first voltage to a corona source positioned over the substrate support, wherein the corona source includes one or more corona wires transferring a corona discharge onto a major surface of the substrate to pole the piezoelectric film upon application of the first voltage, and wherein the one or more corona wires extend along an axis parallel to the major surface of the substrate; and moving the substrate relative to the corona source, wherein moving the substrate relative to the corona source includes rotating at least the substrate.

21. The method of claim 20, wherein moving the substrate relative to the corona source includes rotating the substrate and the corona source about an axis perpendicular to the major surface of the substrate.

22. The method of claim 20, wherein moving the substrate relative to the corona source includes translating one or both of the substrate and the corona source along a direction parallel to the major surface of the substrate.

23. The method of claim 20, further comprising:
applying a second voltage to a grid electrode positioned between the corona source and the substrate support.

24. The method of claim 23, wherein the first voltage is between about 7 kV and about 16 kV relative to the substrate support and the second voltage is between about 1 kV and about 10 kV relative to the substrate support.

25. The method of claim 20, further comprising:
measuring a piezoelectric coefficient of the piezoelectric film during or after the piezoelectric film is poled.

\* \* \* \* \*